United States Patent [19]

Higashisaka et al.

[11] Patent Number: 5,668,491

[45] Date of Patent: Sep. 16, 1997

[54] VARIABLE DELAY CIRCUIT

[75] Inventors: Norio Higashisaka; Akira Ohta, both of Itami, Japan

[73] Assignee: Mitsubishi Denki Kabushiki Kaisha, Tokyo, Japan

[21] Appl. No.: 585,436

[22] Filed: Jan. 11, 1996

[30]  Foreign Application Priority Data

Jun. 6, 1995 [JP] Japan .................................. 7-139122

[51] Int. Cl.$^6$ ....................................................... H03K 5/13
[52] U.S. Cl. ........................... 327/277; 327/270; 327/276
[58] Field of Search .................................. 327/261–264, 327/269, 270, 272, 276, 277, 285, 288, 237, 239, 258, 259

[56]  References Cited

U.S. PATENT DOCUMENTS

| | | | |
|---|---|---|---|
| 5,179,438 | 1/1993 | Morimoto | 327/263 |
| 5,349,612 | 9/1994 | Guo et al. | 327/270 |
| 5,355,027 | 10/1994 | Shimada et al. | 307/247.1 |
| 5,428,309 | 6/1995 | Yamauchi et al. | 327/262 |

FOREIGN PATENT DOCUMENTS

| | | | |
|---|---|---|---|
| 3715083 | 11/1987 | Germany . | |
| 60-87517 | 5/1985 | Japan | 327/270 |
| 1-228315 | 9/1989 | Japan | 327/277 |
| 1-295518 | 11/1989 | Japan | 327/262 |
| 2-119313 | 5/1990 | Japan | 327/261 |
| 2-184109 | 7/1990 | Japan | 327/270 |
| 2-284523 | 11/1990 | Japan . | |
| 335613 | 2/1991 | Japan . | |
| 5-191233 | 7/1993 | Japan | 327/261 |

OTHER PUBLICATIONS

Patent Abstracts of Japan, E–372, vol. 10, No. 5, Jan. 10, 1986.

*Primary Examiner*—Timothy P. Callahan
*Assistant Examiner*—T. T. Lam
*Attorney, Agent, or Firm*—Leydig, Voit & Mayer, Ltd.

[57]  ABSTRACT

A variable delay circuit includes a gate chain of first to n-th delay gates (n is an integer larger than 2) connected in series to each other via delay gate wirings having respective wiring lengths, the first delay gate receiving an input signal for delay; first to n-th separator gates to which the outputs of the first to n-th delay gates are input, respectively; first to n-th separator gate wirings having wiring lengths successively shortened from the first to n-th separator gate, first ends respectively connected to the first to n-th separator gates, and second ends connected to an n:1 selector, for selecting one of the outputs of the first to n-th separator gates in according with a select signal, and a select signal generating circuit for controlling the n:1 selector. The variable delay circuit has no loss of resolution due to parasitic capacitance of the delay gate wirings.

10 Claims, 10 Drawing Sheets

VARIABLE DELAY CIRCUIT

FIELD OF THE INVENTION

The present invention relates to a variable delay circuit for obtaining a desired timing signal employing a digital circuit, particularly, to a variable delay circuit comprising a gate chain and a selector and having an improved performance.

BACKGROUND OF THE INVENTION

FIG. 18 is a diagram illustrating a prior art variable delay circuit. In the figure, reference numerals $1_1$ to $1_n$ designate n delay gates for delaying an input signal for a predetermined time. Reference numeral 100 designates a gate chain comprising the delay gates $1_1$ to $1_n$ connected in series each other. Reference numeral 150 designates an n:1 selector which receives the signals from the connection nodes of respective gates of the gate chain 100 and selects one among the signals to selectively output it. Reference numeral 151 designates a select signal generating circuit for generating a signal for controlling the n:1 selector 150.

A description is given of the operation. A pulse signal input to the input terminal IN of the first stage delay gate $1_1$ of the gate chain 100 transmitted through the gate chain 100, which is delayed by the respective delay gates, and the pulse signals at the connection nodes of the respective delay gates are input to the n:1 selector 150. Since a selection data is given to the n:1 selector 150, a pulse signal having a predetermined delay against the pulse signal input to the input terminal IN of the first stage gate $1_1$ of the gate chain 100 is output to the output terminal OUT of the n:1 selector 150 in accordance with the control signal from the select signal generating circuit 151.

The prior art variable delay circuit constructed as described above has the following problems. Particularly, the minimum delay time that can be varied, i.e., the resolution of such variable delay circuit, is regulated by the delay time (hereinafter referred to as $t_{di}$) of respective delay gates constituting the gate chain 100. Actually, the delay resolution becomes larger than the delay time $t_{di}$ due to the parasitic capacitance of wiring as shown in FIG. 19. In FIG. 19, reference characters $1_k$, $1_{k+1}$ designate k-th and (k+1)-th gates, respectively, included in the gate chain 100. Reference character $CL_{2k}$ designates a parasitic capacitance due to the wiring for connecting the output of the delay $1_k$ to the input of the delay $1_{k+1}$, and reference character $CL_{2k}$ designates a parasitic capacitance due to the wiring for connecting the output of the delay gate $1_k$ to the n:1 selector 150. Therefore, the delay time in the k-th gate $1_K$ becomes the sum of the gate delay $t_{di}$ and the load delay due to the parasitic capacitance $CL_{1K}$ and $CL_{2K}$, resulting in a reduction in the resolution of the variable delay circuit, i.e., an increase in each gate delay time. Since the increment of delay time due to the parasitic capacitance amounts to 0.5~1.5 times the gate delay $t_{di}$, the resolution of such variable delay circuit becomes 1.5~2.5 times the gate delay time $t_{di}$, which is so large as to be non-negligible.

As a countermeasure to this reduction in resolution, it is suspected to suppress the reduction in resolution due to reduction of the delay time $t_{di}$ of the delay gate. However, in order to reduce the delay time $t_{di}$ of the delay gate, it is required to increase the size of the transistors constituting the delay gate, resulting in an increase in power dissipation.

SUMMARY OF THE INVENTION

It is an object of the present invention to provide a variable delay circuit that invites no reduction in resolution due to parasitic capacitance of wiring of delay gates and no increase in power dissipation.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a variable delay circuit includes a gate chain comprising a first to an n-th delay gates (n is an integer larger than 2) connected in series to each other via delay gate wirings having respective wiring lengths, to the first delay gate an input signal for delay being input, a first to an n-th separator gates to which the outputs of the first to an n-th delay gates are input, respectively, a first to an n-th separator gate wirings of which lengths are successively shortened from the first to the n-th, whose one ends are respectively connected to the first to n-th separator gates, and an n:1 selector to which the other ends of the first to n-th separator gate wirings are connected, for selecting one of the outputs of the first to the n-th separators to output it in accordance with a select signal. Therefore, deterioration in resolution caused by parasitic capacitance of the delay gate wirings is suppressed.

According to a second aspect of the present invention, a variable delay circuit includes a gate chain comprising a first to an n-th delay gates (n is an integer larger than 2) connected in series to each other via delay gate wirings having respective wiring lengths, to the first delay gate an input signal for delay being input, and an n:1 separating selector to whose, respectively, outputs of the first to n-th delay gates are connected n inputs and one of the inputs is selected to output it in accordance with a select signal. The n:1 separating selector comprises the first to n-th separator gates in the selector respectively receiving the outputs of the first to the n-th delay gates, a selective gate which receives the outputs of the first to n-th separator gates in the selector and outputs one of the inputs, and the first to n-th separator gate wirings in the selector having lengths successively shortened from the first to the n-th, whose one ends are connected to the first to n-th separator gates in the selector and other ends are connected to the selective gate. Therefore, a variable delay circuit of which deterioration in resolution caused by parasitic capacitance of the delay gate wirings is suppressed is obtained with an easy structure.

According to a third aspect of the present invention, in the above-described variable delay circuit, the differences in the lengths of the separator gate wirings from the first to the n-th are respectively equal to the lengths of the respective delay gate wirings of the gate chain. Therefore, resolution of the variable delay circuit is equal to delay time of the delay gate.

According to a fourth aspect of the present invention, in the above-described variable delay circuit, the differences in the lengths of the separator gate wirings from the first to the n-th are respectively larger than the lengths of the respective delay gate wirings of the gate chain. Therefore, resolution of the variable delay circuit is smaller than delay time of the delay gate.

According to a fifth aspect of the present invention, in the above-described variable delay circuit, the first to n-th separator gate wirings have wiring lengths respectively including added the wiring length for removing variation in the gate delay times of the first to n-th delay gates. Therefore, variation of resolution of the variable delay circuit due to process variation, temperature variation, power supply voltage variation, and the like, is suppressed.

According to a sixth aspect of the present invention, in the above-described variable delay circuit, the first to n-th separator gates are inverter gates. Therefore, the separator gate wirings are shortened as compared with that in the above-described variable delay circuit when the resolutions of variable delay circuits are equal.

According to a seventh aspect of the present invention, in the above-described variable delay circuit, the sizes of transistors constituting the first to n-th separator gates are smaller than those of transistors constituting the first to n-th delay gates. Therefore, the separator gate wirings are shortened as compared with that in the above-described variable circuit when the resolutions of variable delay circuits are equal.

According to an eighth aspect of the present invention, A variable delay circuit comprises a gate chain comprising a first to an n-th delay gates (n is an integer larger than 2) connected in series to each other via delay gate wirings having respective wiring lengths, to the first delay gate an input signal for delay being input, a first to an n-th separator circuits receiving the outputs of the first to n-th gates of the gate chain and having a first to an m-th separating systems respectively, an (m×n):1 selector which receives outputs of the first to n-th separator circuits at its (m×n) inputs and select one of the inputs to output it in accordance with a select signal. The each first to m-th separating systems of the each first to n-th separating circuits includes separator gates whose input sides are connected in common, separating gate wirings whose one ends are connected to the outputs of the separator gates and whose other ends are connected to the inputs of the (m×n):1 selector, and the lengths of the m×n piece of separator gate wirings are successively shortened from the first separator system side of the first separator circuit to the m-th separator system side of the n-th separator circuit. Therefore, the resolution is further enhanced without increasing the stage number of the delay gates, in the variable delay circuit in which the deterioration in resolution caused by the parasitic capacitance of the delay gate wirings is suppressed.

According to a ninth aspect of the present invention, a variable delay circuit comprises a gate chain comprising a first to an n-th delay gates (n is an integer larger than 2) connected in series to each other via delay gate wirings having respective wiring lengths, to the first delay gate a signal for delay being input, a first to an n-th separator circuits receiving the outputs of the first to n-th gates of the gate chain at their inputs and having a first to an m-th separating systems, respectively, a first to an m-th n:1 selectors to whose n pieces of inputs the outputs of the same numbered separator systems selected from the first to the m-th separator systems in the first to the n-th separating circuits are respectively input, and which select one of the inputs to output it in accordance with respective select signals, respectively. The each first to m-th separating systems of the each first to n-th separating circuits has separator gates whose input sides are connected in common, and separating gate wirings whose one ends are connected to the outputs of the separator gates and whose other ends are connected respectively to the required inputs of the first to m-th n:1 selectors. The lengths of the separator gate wirings in the same numbered separator systems in the first to the n-th separating circuits are successively shortened from the first separator circuit side to the n-th separator circuit side, and the differences in wiring lengths among respective separating systems are different from each other. Therefore, several resolutions of the variable delay circuit are set and one of them is selected arbitrarily, in the variable delay circuit in which the deterioration in resolution caused by the parasitic capacitance of the delay gate wirings is suppressed.

According to a tenth aspect of the present invention, in the above-described variable delay circuit, the differences in the wiring lengths of the first separator gate wirings among the first to n-th separating circuits are respectively equal to the lengths of the respective delay gate wirings of the gate chain. Therefore, the resolution of the variable delay circuit in the first separating system is equal to delay time of the delay gate.

According to an eleventh aspect of the present invention, in the above-described variable delay circuit, the differences in the lengths of the first separator gate wirings among the first to n-th separating circuits are respectively larger than the lengths of the respective delay gate wirings of the gate chain. Therefore, the resolution of the variable delay circuit in the first separating system is smaller than the delay time of the delay gates.

According to a twelfth aspect of the present invention, in the above-described variable delay circuit, the separator gate wirings in the first to n-th separator circuits have wiring lengths respectively including added wiring length for removing variations in the gate delay times of the first to the n-th delay gates. Therefore, the variation of resolution of the variable delay circuit due to the process variation, temperature variation, power supply voltage variation, and the like is suppressed.

According to a thirteenth aspect of the present invention, in the above-described variable delay circuit, the separator gates in the first to n-th separator circuits are inverter gates. Therefore, the separator gate wirings are shortened as compared with that in the above-described variable delay circuit when the resolutions of the variable delay circuits are equal.

According to a fourteenth aspect of the present invention, in the above-described variable delay circuit, the sizes of transistors constituting the separator gates in the first to the n-th separator circuits are smaller than that of transistors constituting the first to the n-th delay gates. Therefore, the separator gate wirings are shortened as compared with that in the above-described variable delay circuit when the resolutions of the variable delay circuits are equal.

DETAILED DESCRIPTION OF THE PREFERRED EMBODIMENTS

Figure 1:
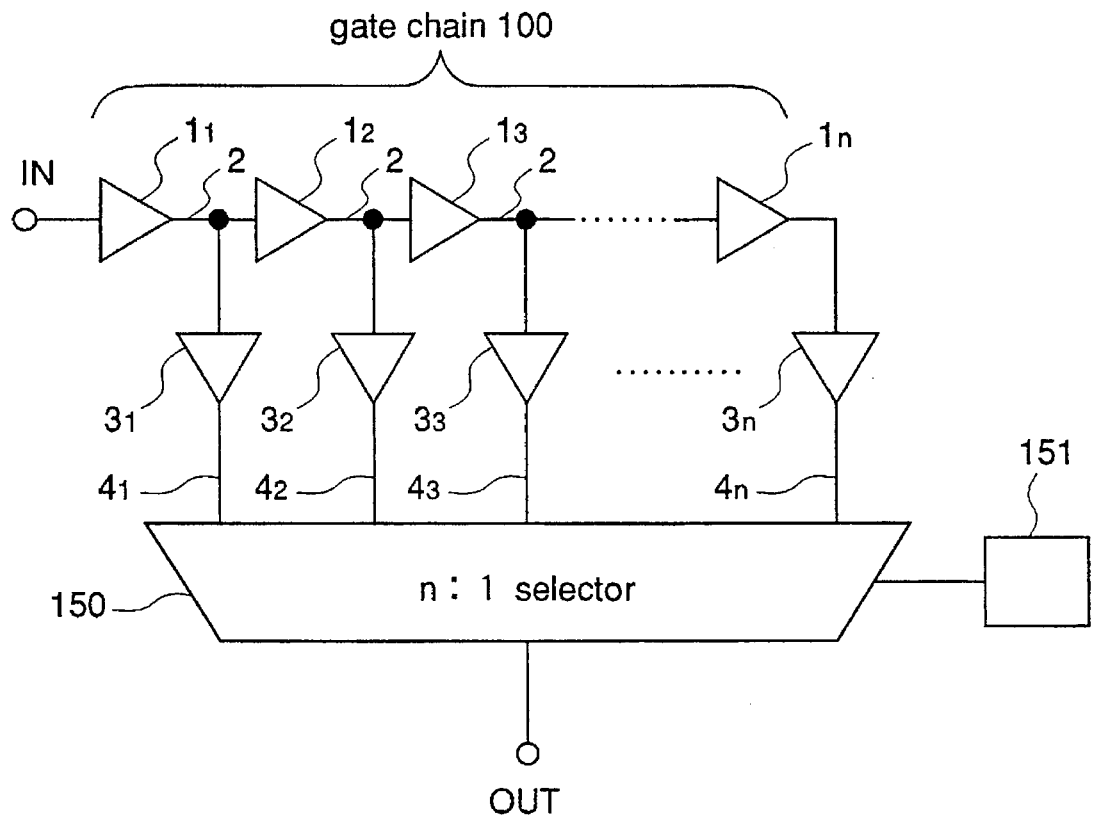
FIG. 1 is a diagram illustrating a variable delay circuit according to a first embodiment of the present invention.

FIG. 1 is a diagram illustrating a circuit diagram of a variable delay circuit according to a first embodiment of the present invention.

This first embodiment is implemented with an input terminal IN to which a signal for delay is input, a gate chain 100 comprising n delay gates $1_1, \ldots, 1_n$ delaying the input signal for a predetermined time, respectively, being respectively connected in series to each other via delay gate wirings 2, n separator gates $3_1, \ldots, 3_n$ whose inputs are respectively connected to connection nodes of the gate chain 100, an n:1 selector 150 which receives the outputs of the n separator gates $3_1, \ldots, 3_n$ at its inputs and selects one of them to output it, a selector signal generating circuit 151 for control of a n:1 selector 150, n separator gate wirings $4_1, \ldots, 4_n$ for connection of the separator gates $3_1, \ldots, 3_n$ and the n:1 selector 150.

Here, the delay time of respective delay gates $1_1, \ldots, 1_n$ is $t_{di}$, the delay time of respective separator gates $3_1, \ldots, 3_n$ is $t_p$, and the wiring length of the delay gate wiring 2 is $\Delta L$.

In addition, the wiring lengths of the separator gate wirings $4_1, \ldots, 4_n$ are as follows:

| | |
|---|---|
| first stage: | $(n-1)\Delta L + \Delta l$ |
| second stage: | $(n-2)\Delta L + \Delta l$ |
| third stage: | $(n-3)\Delta L + \Delta l$ |
| . | |
| . | |
| n-th stage: | $\Delta l$. |

Figure 2:
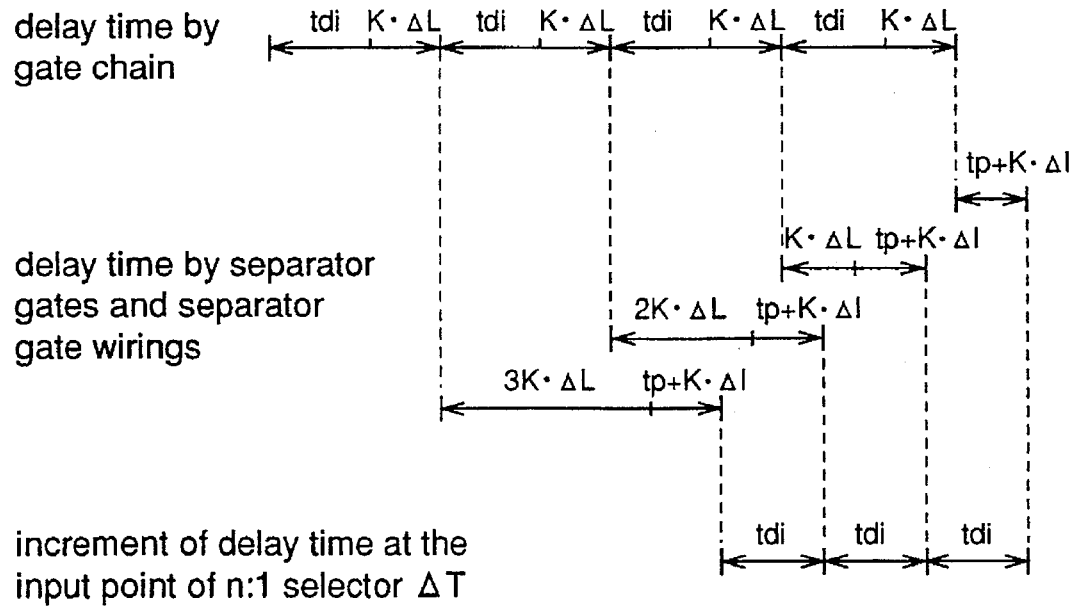
FIG. 2 is a timing chart illustrating the operation of the variable delay circuit of the first embodiment.

A description is given of the operation of this embodiment with reference to a case where the number of the delay gates is 4 (n=4). FIG. 2 is a timing chart for explaining the resolution of this embodiment in a case where n=4. In the figure, reference character K represents dependency of the gate delay time on the wiring length that is determined dependent on the parasitic capacitance of the wiring connected to the gate, the size of the transistor constituting the gate, and the like, i.e., an increment of delay time per a wiring length of 1 mm. Therefore, K·ΔL represents an increment of gate delay time in a case where the wiring length of the delay gate wiring 2 is ΔL. Here, the same dependency of the gate delay time on the wiring length K is applied to all delay gates and separator gates.

When a signal for delay is input to the gate chain 100, the input signal is delayed by each delay gate constituting the gate chain 100 by $t_{di}$+K·ΔL. On the other hand, the outputs of respective delay gates $1_1, \ldots, 1_4$ are applied to the n:1 selector 150 through the separator gates $3_1, \ldots, 3_4$. Then, the wiring lengths of respective separator gate wirings $4_1, \ldots, 4_4$ are set to become successively shorter by ΔL and are defined as follows;

first stage separator gate wiring $4_1$: 3ΔL+Δl second stage separator gate wiring $4_2$: 2ΔL+Δl third stage separator gate wiring $4_3$: ΔL+Δl fourth stage separator gate wiring $4_4$: Δl, the delay times due to the respective stage separator gates $3_1, \ldots, 3_4$ and the separator gate wirings $4_1, \ldots, 4_4$ become as follows:

first stage: 3K·ΔL+($t_p$+K·Δl)

second stage: 2K·ΔL+($t_p$+K·Δl)

third stage: K·ΔL+($t_p$+K·Δl)

fourth stage: $t_p$+K·Δl, becoming successively smaller by K·ΔL. Therefore, as shown at a lower stage of FIG. 2, the increment ΔT of the delay time at the input timing of the n:1 selector 150 becomes, $$\Delta T = t_{di},$$

which is equal to the delay time $t_{di}$ of the delay gate with no load, thereby resulting in no deterioration in resolution of the variable delay circuit.

In this first embodiment, the wiring delay due to the delay gate wiring 2 in the gate chain 100 can be canceled by the difference in the wiring lengths of the respective separator gate output wirings $4_1, \ldots, 4_n$, whereby a variable delay circuit having no deterioration in resolution due to the wiring delay can be obtained.

Embodiment 2

Figure 3:
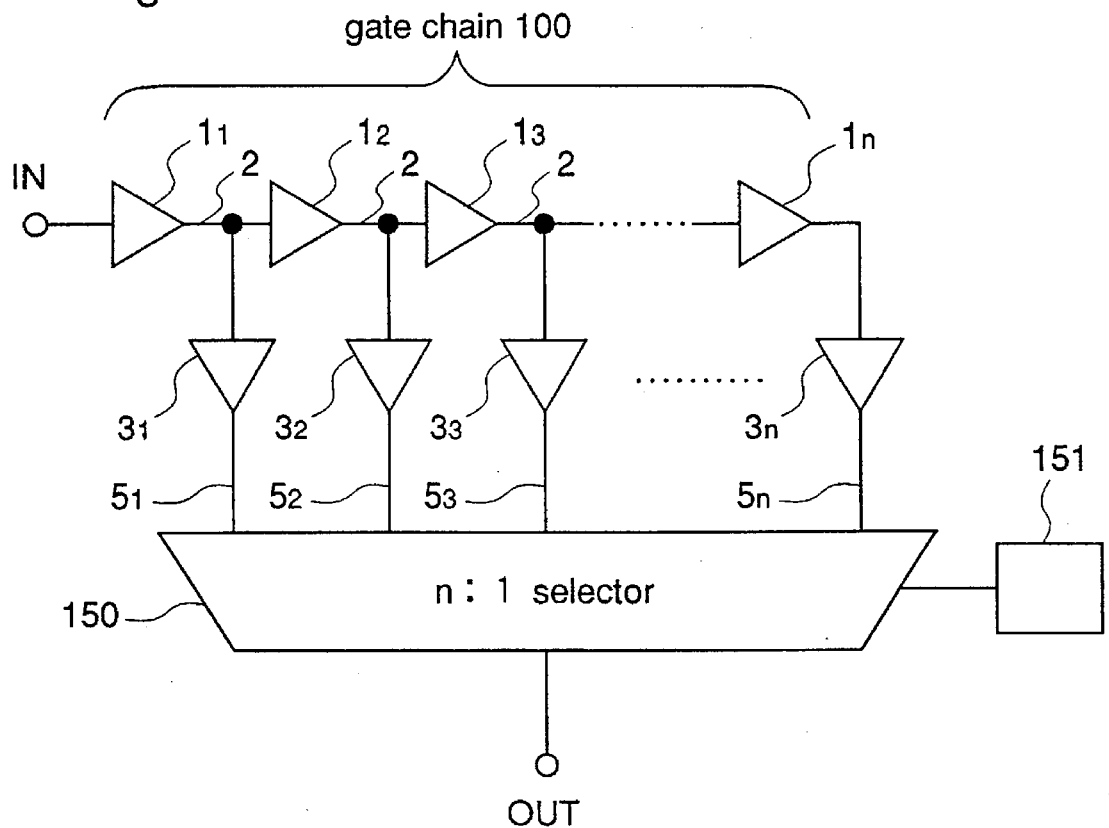
FIG. 3 is a diagram illustrating a variable delay circuit according to a second embodiment of the present invention.

FIG. 3 is a diagram illustrating a variable delay circuit according to a second embodiment of the present invention.

This second embodiment is implemented with an input terminal IN to which a signal for delay is input, a gate chain comprising n delay gates $1_1, \ldots, 1_n$ delaying the input signal for a predetermined time, respectively, being respectively connected in series to each other via delay gate wirings 2, n separator gates $3_1, \ldots, 3_n$ whose inputs are respectively connected to connection nodes of the gate chain 100, an n:1 selector 150 which receives the outputs of the n separator gates at its inputs and selects one of them to output it, a selector signal generating circuit 151 for controlling the n:1 selector 150, and separator gate wirings $5_1, \ldots, 5_n$ for connecting the separator gates $3_1, \ldots, 3_n$ with the n:1 selector 150.

Here, the delay time of respective delay gates $1_1, \ldots, 1_n$ is $t_{di}$, and the wiring length of the delay gate wiring 2 is ΔL.

In addition, the wiring lengths of the separator gate wirings $5_1, \ldots, 5_n$ are as follows:

| | |
|---|---|
| first stage: | $(n-1)(\Delta L + a) + \Delta l$ |
| second stage: | $(n-2)(\Delta L + a) + \Delta l$ |
| third stage: | $(n-3)(\Delta L + a) + \Delta l$ |
| . | |
| . | |
| n-th stage: | $\Delta l$, | here, a is a positive integer.

In other words, the variable delay circuit of this second embodiment is produced having differences between the wiring lengths of respective separator gate wirings by ($\Delta L+a$) in the variable delay circuit of the first embodiment.

Figure 4:
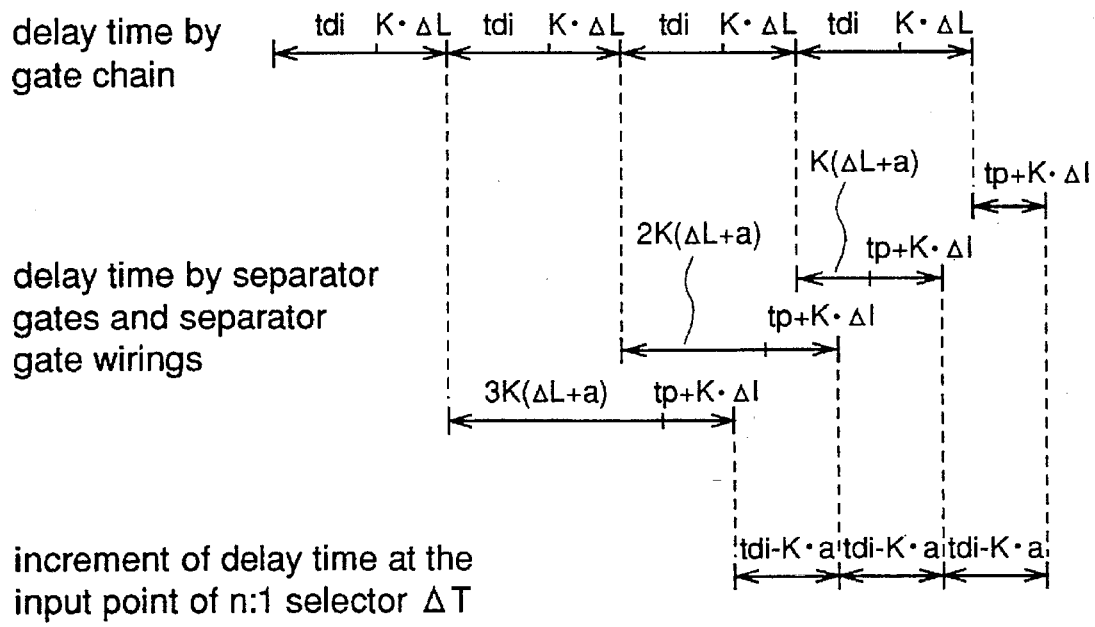
FIG. 4 is a timing chart illustrating the operation of the variable delay circuit of the second embodiment.

A description is given of the operation of this second embodiment with reference to a case where the number of the delay gates is 4 (n=4). FIG. 4 is a timing chart for explaining the resolution of this embodiment in a case where n=4. In the figure, reference character K represents dependency of the gate delay time on the wiring length that is determined dependent on the parasitic capacitance of the wiring connected to the gate and the size of the transistor constituting the gate, and the like, i.e., an increment of delay time per a wiring length of 1 mm. Thus, $K \cdot \Delta L$ represents an increment of gate delay time in a case where the wiring length of the delay gate wiring 2 is $\Delta L$. Here, the same dependency of the gate delay time on the wiring length K is applied to all delay gates and separator gates.

When a signal for delay is input to the gate chain 100, the input signal is delayed by respective delay gates constituting the gate chain 100 by $t_{di}+K \cdot \Delta L$. On the other hand, the outputs of respective delay gates $1_1, \ldots, 1_4$ are applied to the n:1 selector 150 through the separator gates $3_1, \ldots, 3_4$. The output wiring lengths of respective separator gate wirings $5_1, \ldots, 5_4$ are set to become successively shorter by $\Delta L$ as follows;

first stage separator gate wiring $5_1$: $3(\Delta L+a)+\Delta l$ second stage separator gate wiring $5_2$: $2(\Delta L+a)+\Delta l$ third stage separator gate wiring $5_3$: $(\Delta L+a)+\Delta l$ fourth stage separator gate wiring $5_4$: $\Delta l$, and the delay times due to the respective stage separator gates $3_1, \ldots, 3_4$ and the separator gate wirings $5_1, \ldots, 5_4$ become as follows:

first stage: $3K \cdot (\Delta L+a)+(t_p+K \cdot \Delta l)$ second stage: $2K \cdot (\Delta L+a)+(t_p+K \cdot \Delta l)$ third stage: $K \cdot (\Delta L+a)+(t_p+K \cdot \Delta l)$ fourth stage: $t_p+K \cdot \Delta l$, becoming smaller by $K \cdot (\Delta L+a)$. Therefore, as shown in a lowermost stage of FIG. 4, the increment $\Delta T$ of the delay time at the input timing of the n:1 selector 150 becomes, $$\Delta T = t_{di} - K \cdot a$$

In this second embodiment, a variable delay circuit which has further enhanced the resolution relative to the first embodiment is obtained.

While a is a positive number in the above-described embodiment, resolution of the delay gate can be also larger than the delay time $t_{di}$ of the one stage delay gate if a is a negative number.

Embodiment 3

Figure 5:
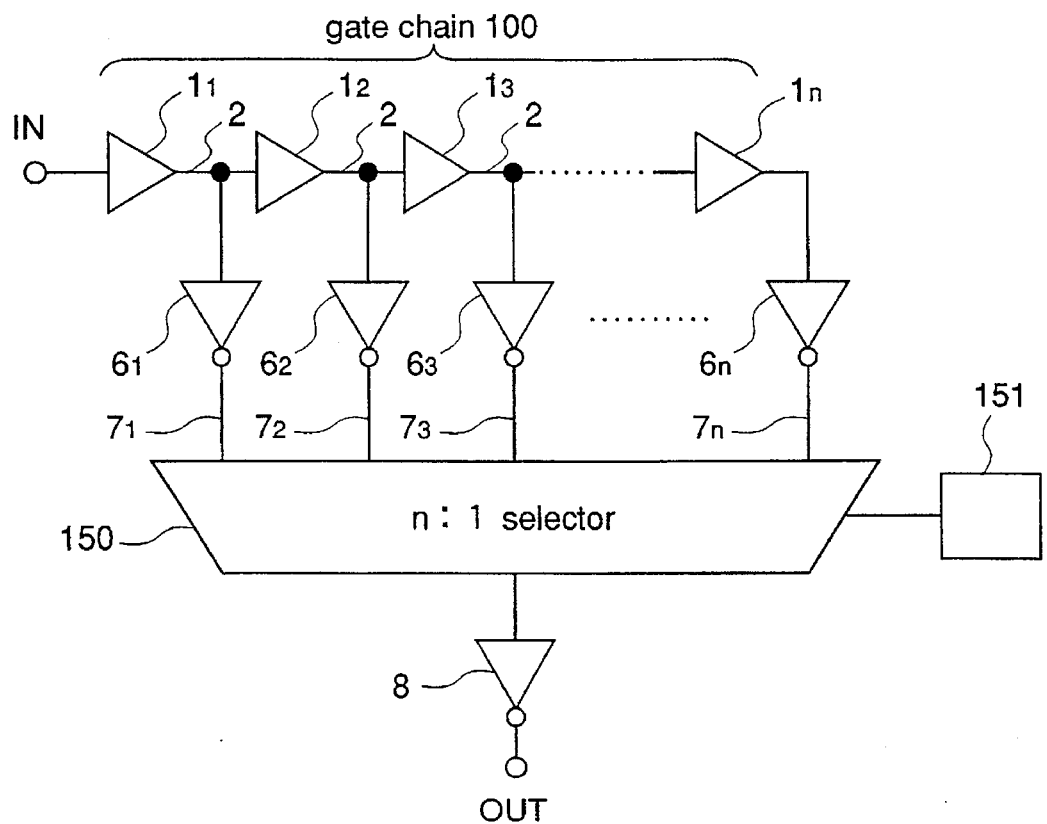
FIG. 5 is a diagram illustrating a variable delay circuit according to a third embodiment of the present invention.

FIG. 5 is a diagram illustrating a third embodiment of the present invention.

Although a variable delay circuit which does not reduce resolution is obtained in the first and the second embodiments, these embodiments involve problems in that the lengths of the separator gate output wirings, especially, that of the separator gate output wirings of the input side first stage become long.

This third embodiment is directed to solve this problem, and implemented with an input terminal IN to which a signal for delay is input, a gate chain 100 comprising n delay gates $1_1, \ldots, 1_n$ for delaying the input signal for a predetermined time, and being connected in series to each other via delay gate wirings 2, n inverter separator gates $6_1, \ldots, 6_n$ whose respective inputs are connected to respective connection nodes of the gate chain 100, an n:1 selector 150 which receives the outputs of the n inverter separator gates at its inputs and selects one of them to output it, a selector signal generating circuit 151 for controlling the n:1 selector 150, n inverter separator gate wirings $7_1, \ldots, 7_n$ for respectively connecting the inverter separator gates $6_1, \ldots, 6_n$ with the n:1 selector 150, and an inverter 8 for inverting the output of the n:1 selector 150.

Here, the delay time of each of delay gates $1_1, \ldots, 1_n$ is $t_{di}$, and the delay time of each of the inverter separator gates 6 is $t_p$, and the length of the delay gate wiring 2 is $\Delta L$.

In addition, the lengths of the inverter separator gate wirings $7_1, \ldots, 7_n$ are as follows:

| first stage: | $(n-1)\Delta L_1 + \Delta l$ |
|---|---|
| second stage: | $(n-2)\Delta L_1 + \Delta l$ |
| third stage: | $(n-3)\Delta L_1 + \Delta l$ |
| . | |
| . | |
| n-th stage: | $\Delta l$, | becoming successively shorter by $\Delta L_1$.

In other words, the variable delay circuit of this third embodiment is constituted by replacing the separator gate of the variable delay circuit of the first embodiment by an inverter separator gate, i.e., an inverter, performing an inverting operation.

Figure 6:
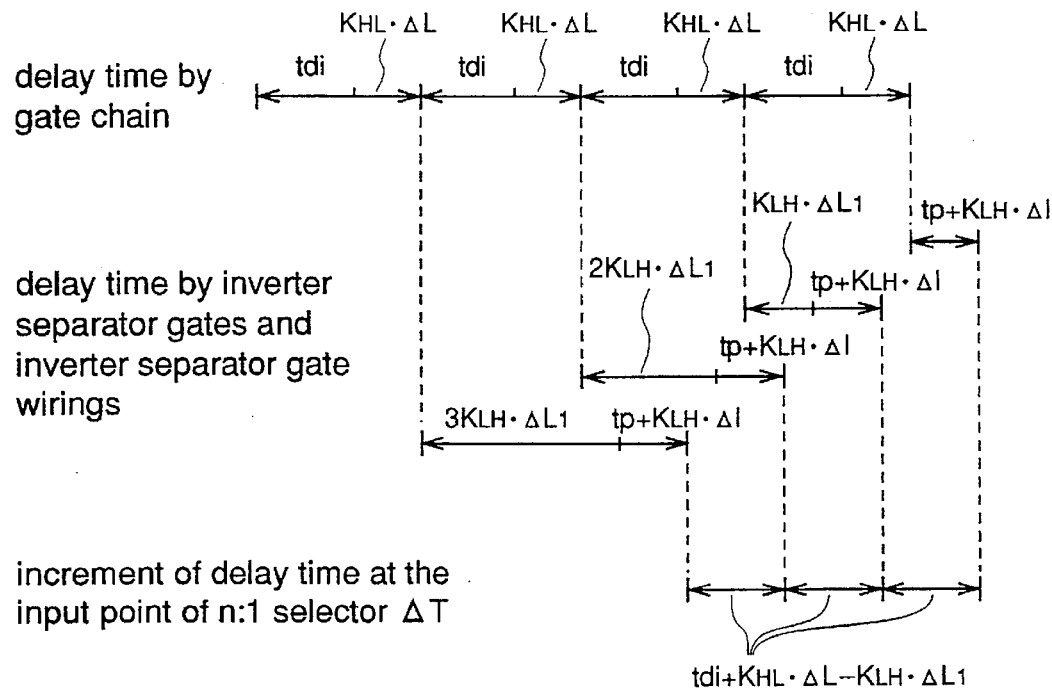
FIG. 6 is a timing chart illustrating the operation of the variable delay circuit of the third embodiment.

A description is given of the operation of this third embodiment with reference to a case where the number of the delay gates is 4 (n=4). FIG. 6 is a timing chart for explaining the resolution of this embodiment in a case where a negative pulse is input to the gate chain 100 of n=4. In the figure, reference characters $K_{HL}$ and $K_{LH}$ represent the wiring length dependency of the gate delay time, i.e., an increment of delay time per a wiring length of 1 mm when a negative pulse is input and a positive pulse is input, respectively. In addition, $K_{HL} \cdot \Delta L$ represents an increment of gate delay time in a case where the length of the delay gate wiring 2 is $\Delta L$ and $K_{LH} \cdot \Delta L_1$ represents an increment of gate delay time in a case where the length of the inverter separator gate wiring 7 is $\Delta L_1$. Here, the wiring length dependency of the gate delay time $K_{HL}$ and $K_{LH}$ which are dependent on the sizes of transistors constituting the delay gates and the parasitic capacitance of the wirings connected to the gates are assumed to be the same in all the delay gates and the inverter separator gates. When a negative signal to be delayed is input to the gate chain 100, the input signal is delayed by the delay gates constituting the gate chain 100 by $t_{di}+K_{HL}\Delta L$, respectively. On the other hand, the outputs of respective delay gates $1_1, \ldots, 1_4$ are applied to the n:1 selector 150 via the inverter separator gates $6_1, \ldots, 6_4$, respectively. Then, the wiring lengths of respective inverter separator gate wirings $7_1, \ldots, 7_4$ are set to become successively shorter by $\Delta L_1$ as follows;

first stage inverter separator gate wiring $7_1$: $3\Delta L_1+\Delta l$ second stage inverter separator gate wiring $7_2$: $2\Delta L_1+\Delta l$ third stage inverter separator gate wiring $7_3$: $\Delta L_1+\Delta l$ fourth stage inverter separator gate wiring $7_4$: $\Delta l$, and the delay times due to the respective stage inverter separator gates $6_1, \ldots, 6_4$ and the inverter separator gate wirings $7_1, \ldots, 7_4$ become as follows:

first stage: $3K_{LH} \cdot \Delta L_1+(t_p+K_{LH} \cdot \Delta l)$ second stage: $2K_{LH} \cdot \Delta L_1+(t_p+K_{LH} \cdot \Delta l)$ third stage: $K_{LH} \cdot \Delta L_1+(t_p+K_{LH} \cdot \Delta l)$ fourth stage: $t_p+K_{LH} \cdot \Delta l$, becoming successively smaller by $K_{LH} \cdot \Delta L_1$. Therefore, as shown in a lower stage of FIG. 6, the increment $\Delta T$ of the delay time at the input timing of the n:1 selector 150 becomes, $$\Delta T = t_{di}+K_{HL} \cdot \Delta L - K_{LH} \cdot \Delta L_1.$$

This means in order to equalize the increment $\Delta T$ of the delay time to the delay time $t_{di}$ of the delay gate when there is no load, it is only required to make $K_{HL} \cdot \Delta L = K_{LH} \cdot \Delta L_1,$ If it is assumed that $K_{HL} = \alpha K_{LH}$, it is possible to represent that $\Delta L_1 = \alpha \Delta L.$ Generally, the wiring length dependency $K_{HL}$ of the gate delay time when the negative pulse is input takes a value of 0.5~0.2 times of the wiring length dependency $K_{LH}$ of the gate delay time when a positive pulse is input, whereby the above-described $\alpha$ becomes $\alpha=0.5$~0.2, and it is possible to shorten the increment $\Delta L_1$ of the wiring length of the inverter separator wirings $7_1, \ldots, 7_n$ compared to the wiring length $\Delta L$ of the delay gate wirings $1_1, \ldots, 1_n$.

In this third embodiment, the same effect as in the first embodiment, i.e., an effect of obtaining a variable delay circuit in which no deterioration occurs in resolution due to the wiring delay and in which the lengths of the inverter separator gate wirings $7_1, \ldots, 7_n$ can be shortened, whereby, owing to reduction in the chip area, the fabrication cost is reduced.

While a case where a negative pulse is applied to the gate chain 100 is described in the described above, a positive pulse can be also applied by employing transistors for the inverter separator gates $6_1, \ldots, 6_n$, with a larger size for depletion type transistors and a smaller size for enhancement type transistors, or making the inverter separator gates of Si transistors and making the $\alpha$ larger than 1, with the same effects as in the third embodiment obtained.

Embodiment 4

Figure 7:
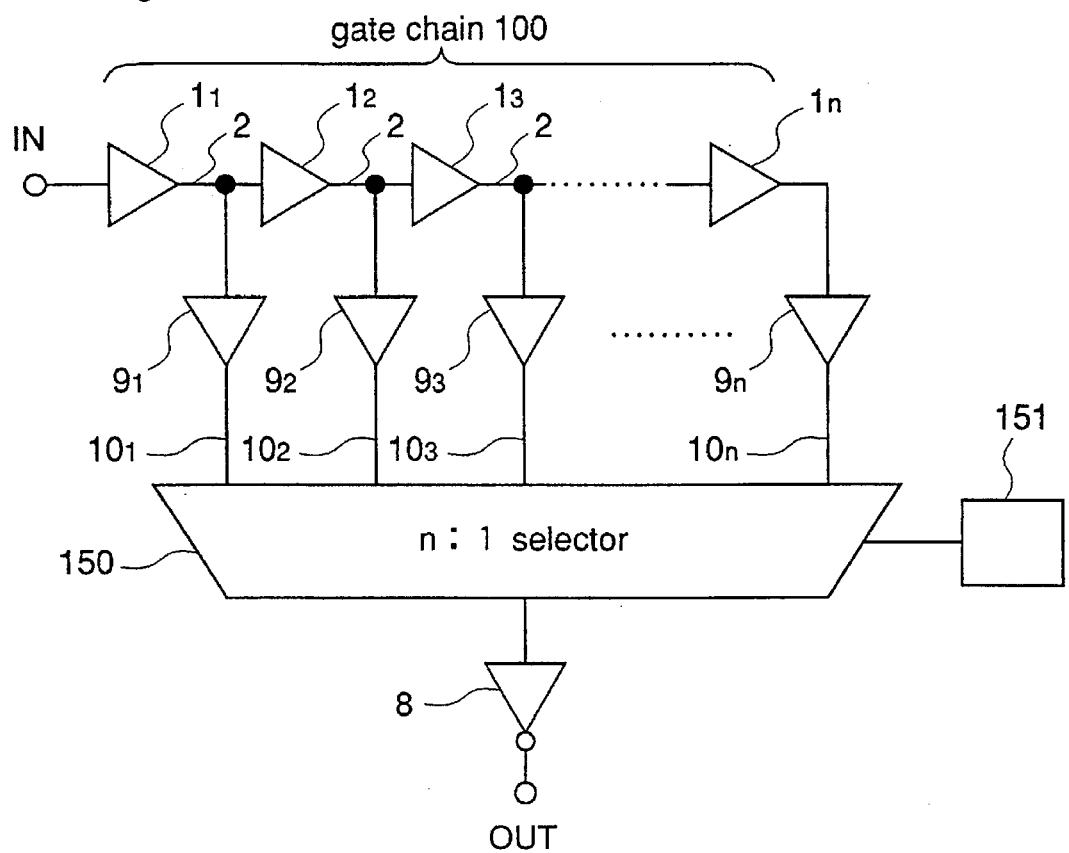
FIG. 7 is a diagram illustrating a variable delay circuit according to a fourth embodiment of the present invention.

FIG. 7 is a diagram illustrating a variable delay circuit according to a fourth embodiment of the present invention.

This fourth embodiment has an object of shortening the wiring length for adding to the outputs of the separator gates of a variable delay circuit that does not deteriorate the resolution as in the third embodiment. This fourth embodiment is implemented with an input terminal IN to which a signal to be delayed is input, a gate chain 100 comprising n delay gates $1_1, \ldots, 1_n$ for delaying the input signal for a predetermined time, and being connected in series to each other via delay gate wirings 2, n separator gates $9_1, \ldots, 9_n$ whose respective inputs are connected to respective connection nodes of the gate chain 100, an n:1 selector 150 which receives the outputs of the n pieces of separator gates $9_1, \ldots, 9_n$ at its inputs and selects one of them to output it, a selector signal generating circuit 151 for controlling the n:1 selector 150, n separator gate wirings $10_1, \ldots, 10_n$ for respectively connecting the separator gates $9_1, \ldots, 9_n$ with the n:1 selector 150, and an inverter 8 for inverting the output of the n:1 selector 150.

Here, the delay time of each of delay gates $1_1, \ldots, 1_n$ is $t_{di}$, and the delay time of each of separator gates $9_1, \ldots, 9_n$ is $t_p$, and the length of the delay gate wiring 2 is $\Delta L$.

In addition, the lengths of the separator gate wirings $10_1, \ldots, 10_n$ are as follows:

| | |
|---|---|
| first stage: | $(n-1)\Delta L_2 + \Delta l$ |
| second stage: | $(n-2)\Delta L_2 + \Delta l$ |
| third stage: | $(n-3)\Delta L_2 + \Delta l$ |
| . | |
| . | |
| . | |
| n-th stage: | $\Delta l$, | becoming successively shorter by $\Delta L_2$.

In other words, the variable delay circuit of this fourth embodiment is produced by making the transistors of the separator gates smaller than the transistors of the delay gates in the variable delay circuit of the first embodiment.

Figure 8:
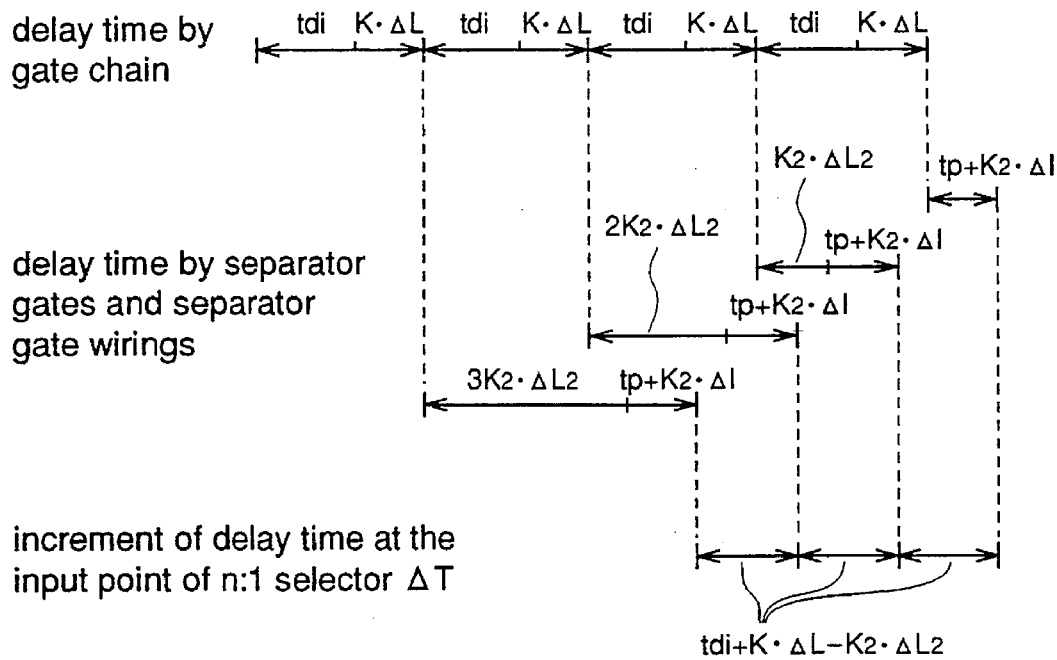
FIG. 8 is a timing chart illustrating the operation of the variable delay circuit of the fourth embodiment.

A description is given of the operation of this fourth embodiment with reference to a case where the number of the delay gates is 4 (n=4). FIG. 8 is a timing chart for explaining the resolution of this embodiment in a case where n=4. In the figure, reference character K represents the wiring length dependency of the gate delay time of respective delay gates $1_1, \ldots, 1_n$, that is dependent on the parasitic capacitance of the wiring connected to the gate and the size of the transistor constituting the gate, or the like, and $K_2$ represents wiring length dependency of the gate delay time of respective separator gates $9_1, \ldots, 9_n$. In addition, $K \cdot \Delta L$ represents an increment of gate delay time in a case where the wiring length of the delay gate wiring 2 is $\Delta L$, and $K_2 \cdot \Delta L_2$ represents an increment of gate delay time in a case where the wiring length of the separator gate wiring 10 is $\Delta L_2$.

When a signal to be delayed is input to the gate chain 100, the input signal is delayed by the delay gates constituting the gate chain 100 by $t_{di} + K \cdot \Delta L$, respectively. On the other hand, the outputs of respective delay gates $1_1, \ldots, 1_4$ are applied to the n:1 selector 150 via the separator gates $9_1, \ldots, 9_4$, respectively. Then, the wiring lengths of respective separator gate wirings $10_1, \ldots, 10_4$ are set to become successively shorter by $\Delta L_2$ as follows;

first stage separator gate wiring $10_1$: $3\Delta L_2 + \Delta l$ second stage separator gate wiring $10_2$: $2\Delta L_2 + \Delta l$ third stage separator gate wiring $10_3$: $\Delta L_2 + \Delta l$ fourth stage separator gate wiring $10_4$: $\Delta l$, and the delay times due to the respective stage separator gates $9_1, \ldots, 9_4$ and the separator gate wirings $10_1, \ldots, 10_4$ become as follows:

first stage: $3K_2 \cdot \Delta L_2 + (t_p + K_2 \cdot \Delta l)$ second stage: $2K_2 \cdot \Delta L_2 + (t_p + K_2 \cdot \Delta l)$ third stage: $K_2 \cdot \Delta L_2 + (t_p + K_2 \cdot \Delta l)$ fourth stage: $t_p + K_2 \cdot \Delta l$, becoming successively smaller by $K_2 \cdot \Delta L_2$. Therefore, as shown in a lower stage of FIG. 8, the increment $\Delta T$ of the delay time at the input timing of the n:1 selector 150 becomes, $\Delta T = t_{di} + K \cdot \Delta L - K_2 \cdot \Delta L_2.$ This means, in order to equalize the increment $\Delta T$ of the delay time to the delay time $t_{di}$ of the delay gate when there is no load, it is only required to make $K \cdot \Delta L = K_2 \cdot \Delta L_2.$ If it is assumed that $K = \beta K_2$, it is possible to represent that $\Delta L_2 = \beta \Delta L.$ Since in this embodiment the transistors constituting the separator gates $9_1, \ldots, 9_n$ are smaller than the transistors constituting the delay gates $1_1, \ldots, 1_n$, $K < K_2$, i.e., $\beta (=K/K_2) < 1$. In other words, the increment $\Delta L_2$ of the wiring length of the separator gate wirings $10_1, \ldots, 10_n$ can be shorter than the increment $\Delta L$ of the wiring length of the delay gate wirings $1_1, \ldots, 1_n$.

In this fourth embodiment, the same advantages as in the first embodiment, i.e., a variable delay circuit in which no deterioration occurs in resolution due to the wiring delay and shortening of the lengths of the separator gate wirings $10_1, \ldots, 10_n$ are achieved, whereby the fabrication cost is reduced owing to reduction in the chip area.

Embodiment 5

Figure 9:
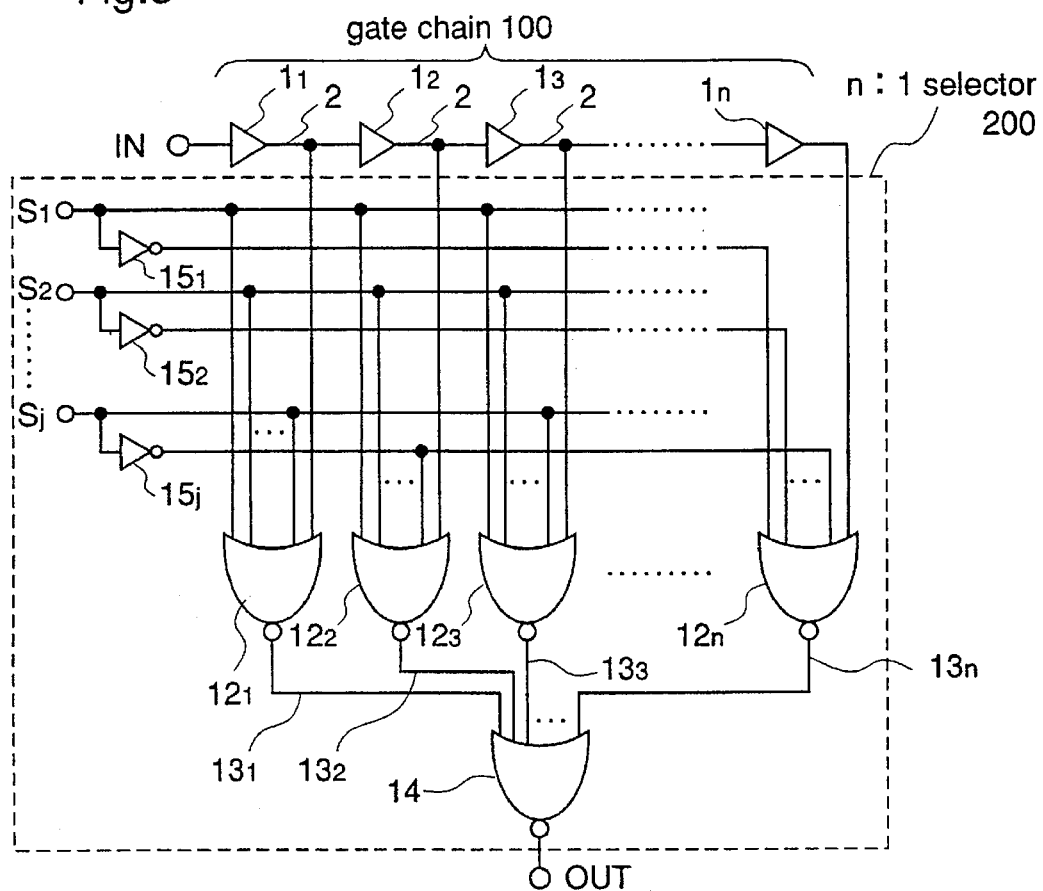
FIG. 9 is a diagram illustrating a variable delay circuit according to a fifth embodiment of the present invention.

While a variable delay circuit that does not reduce resolution is obtained in the first to fourth embodiments, it is further required to provide a separator gate or an inverter separator gate for obtaining that. The variable delay circuit of this fifth embodiment is one that does not reduce the resolution and does not require separator gates, i.e., that enables operation at a further low power dissipation. FIG. 9 is a diagram illustrating a variable delay circuit according to a fifth embodiment of the present invention.

This fifth embodiment is implemented with an input terminal IN to which a signal to be delayed is input, a gate chain 100 comprising n delay gates $1_1, \ldots, 1_n$ for delaying the input signal for a predetermined time, and being connected in series to each other via delay gate wirings 2, and an n:1 selector 200 which receives the outputs of the n delay gates $1_1, \ldots, 1_n$ at its inputs and selects one of them to output it.

The n:1 selector 200 includes:

j select signal input terminals $IN_{S1}, \ldots, IN_{Sj}$ for inputting j (j is an integer satisfying $2^{j-1} \leq n \leq 2^j$) select signals $S_1, \ldots, S_j$, j inverter gates $15_1, \ldots, 15_j$ for generating select inverted signals/$S_1, \ldots, /S_j$ by inverting the j select signals $S_1, \ldots, S_j$, n (j+1) input NOR gates $12_1, \ldots, 12_n$ (hereinafter referred to as separator gates) which receive the respective outputs of the n delay gates $1_1, \ldots, 1_n$ and the select signal or the select inverted signal, to select only one of the separator gates which becomes active in accordance with the select signal, an n input NOR 14 (hereinafter referred to as a selection gate) which receives the outputs of the separator gates $12_1, \ldots, 12_n$ and outputs a NOR function of those inputs, and separator gate wirings $13_1, \ldots, 13_n$ for respectively connecting the separator gates $12_1, \ldots, 12_n$ with the selection gate 14.

Here, the delay time of each of delay gates $1_1, \ldots, i_n$ is $t_{di}$, and the delay time of each of separator gates $12_1, \ldots, 12_n$ of the n:1 selector 200 is $t_p$, and the length of the delay gate wiring 2 is $\Delta L$.

In addition, the lengths of the separator gate wirings $13_1, \ldots, 13_n$ are as follows:

| first stage: | $(n-1)\Delta L_3 + \Delta l$ |
| second stage: | $(n-2)\Delta L_3 + \Delta l$ |
| third stage: | $(n-3)\Delta L_3 + \Delta l$ |
| . | |
| . | |
| . | |
| n-th stage: | $\Delta l$, | becoming successively shorter by $\Delta L_3$.

Figure 10:
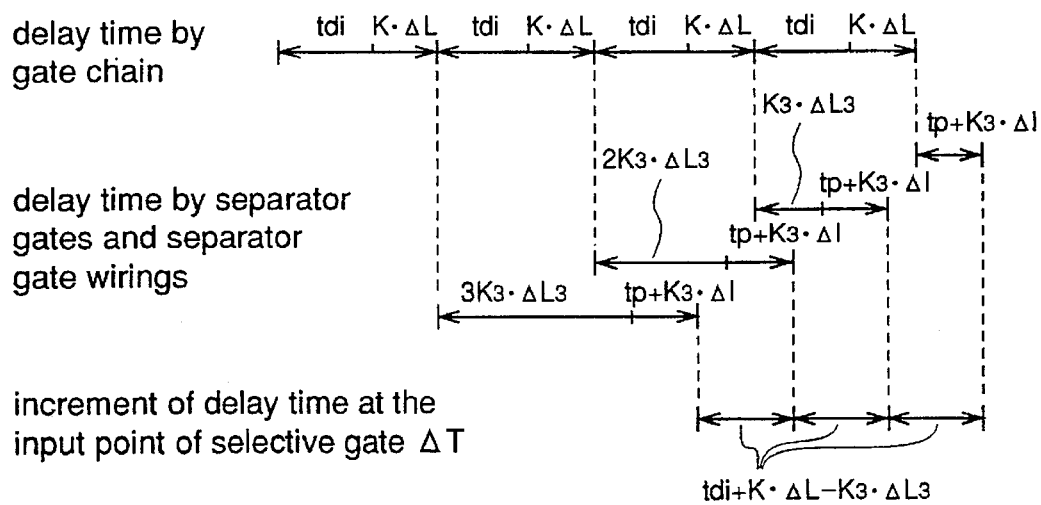
FIG. 10 is a timing chart illustrating the operation of the variable delay circuit of the fifth embodiment.

A description is given of the operation of this fifth embodiment with reference to a case where the number of the delay gates is 4 (n=4). FIG. 10 is a timing chart for explaining the resolution of this embodiment in a case where n=4. In the figure, reference character K represents wiring length dependency of the gate delay time of respective delay gates $1_1, \ldots, 1_n$, that is dependent on the parasitic capacitance of the wiring connected to the gates, the size of the transistors constituting the gates, and the like, and $K_3$ represents wiring length dependency of the gate delay time of respective separator gates $12_1, \ldots, 12_n$. In addition, $K \cdot \Delta L$ represents an increment of gate delay time in a case where the length of the delay gate wiring 2 is $\Delta L$, and $K_3 \cdot \Delta L_3$ represents an increment of gate delay time in a case where the length of the separator gate wiring 13 is $\Delta L_3$.

When a signal to be delayed is input to the gate chain 100, the input signal is delayed by the delay gates $1_1, \ldots, 1_4$ constituting the gate chain 100 by $t_{di}+K \cdot \Delta L$, respectively. On the other hand, the outputs of delay gates $1_1, \ldots, 1_4$ are applied to the respective separator gates $12_1, \ldots, 12_4$ of the n:1 selector 200 and to each of separator gates $12_1, \ldots, 12_4$, a select signal or a select inverted signal is input so that one of the separator gates becomes active in accordance with the select signal. In addition, when the separator gate selected in accordance with the select signal becomes active, the output of the delay gate 1 which is input to the separator gate is inverted and output. Since the wiring lengths of the separator gate wirings 13 are set to become successively shorter by $\Delta L_3$ as described above, the lengths of the separator gate wirings become as follows:

first stage separator gate wiring $13_1$: $3\Delta L_3 + \Delta l$ second stage separator gate wiring $13_2$: $2\Delta L_3 + \Delta l$ third stage separator gate wiring $13_3$: $\Delta L_3 + \Delta l$ fourth stage separator gate wiring $13_4$: $\Delta l$, and, the delay times of the respective stage separator gates $12_1, \ldots, 12_4$ and the separator gate wirings $13_1, \ldots, 13_4$ become as follows:

first stage: $3K_3 \cdot \Delta L_3 + (t_p + K_3 \cdot \Delta l)$ second stage: $2K_3 \cdot \Delta L_3 + (t_p + K_3 \cdot \Delta l)$ third stage: $K_3 \cdot \Delta L_3 + (t_p + K_3 \cdot \Delta l)$ fourth stage: $t_p + K_3 \cdot \Delta l$, becoming successively smaller by $K_3 \cdot \Delta L_3$. Therefore, as shown in the lower stage of FIG. 10, the increment $\Delta T$ of the delay time at the input timing of the selector gate 14 becomes, $$\Delta T = t_{di} + K \cdot \Delta L - K_3 \cdot \Delta L_3$$

This means, in order to equalize the increment $\Delta T$ of the delay time to the delay time $t_{di}$ of the delay gate when there is no load, it is only required to make $$K \cdot \Delta L = K_3 \cdot \Delta L_3$$

Here, since in this embodiment a NOR circuit (corresponding to the inverted separator gate of the third embodiment) is employed for the separator gate 12, $\Delta L_3$ is related to $\Delta L$ as in the following:

$$\Delta L > \Delta L_3$$

In this fifth embodiment, since the NOR circuits constituting the n:1 selector 200 are used also as a separator gate (or a inverted separator gate) which was further necessary in the first to fourth embodiments, a variable delay circuit which has the same effects as in the first embodiment, i.e., no reduction in resolution due to the wiring delay occurs can be obtained, and the number of parts constituting the circuit can be reduced, resulting in reduced fabrication cost, reduced power dissipation, and improved degree of integration.

Figure 11:
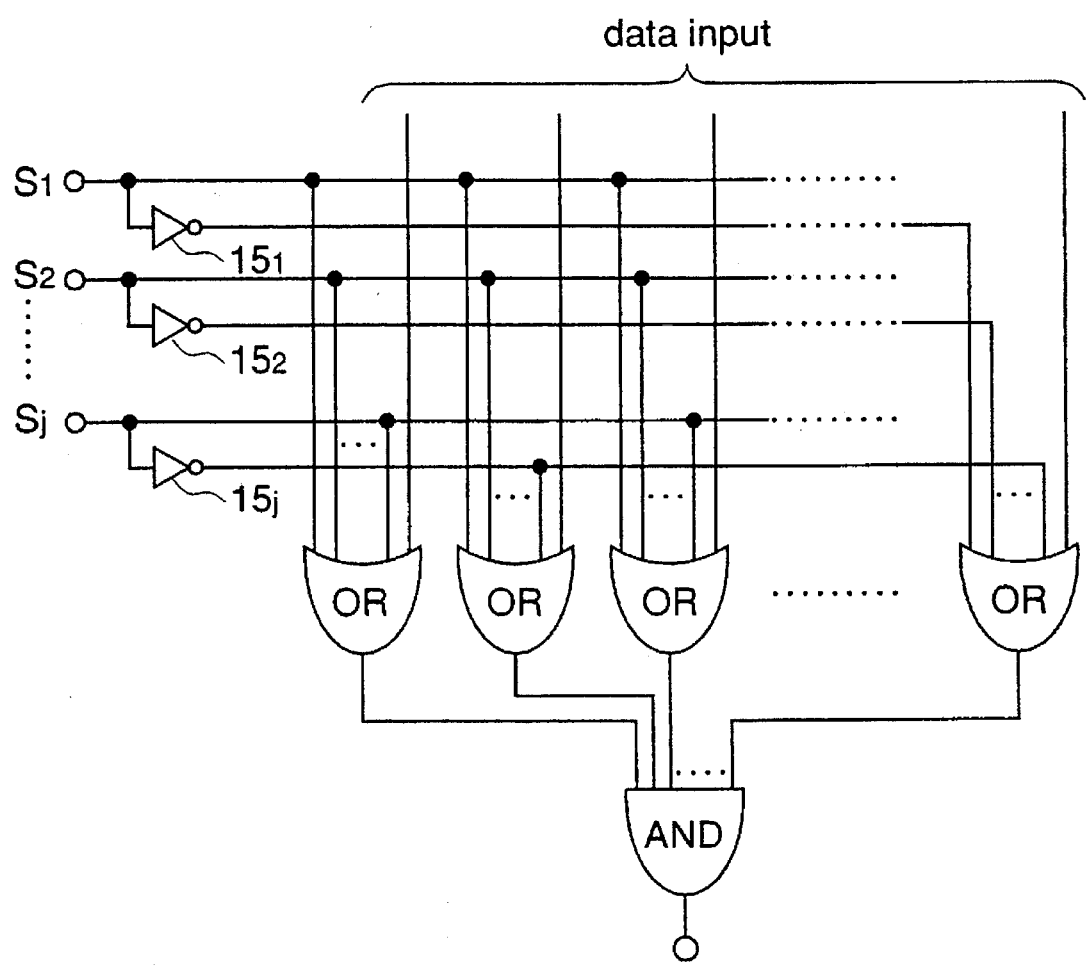
FIG. 11 is a diagram illustrating an n:1 selector according to another construction.

While an n:1 selector is constituted by using NOR circuits for both a separator gate and a selection gate in this fifth embodiment, this embodiment can be applied not only to the n:1 selector having this circuit construction but also to an n:1 selector that is constituted by using an OR circuit for the separator gate and an AND circuit for the selection gate as shown in FIG. 11, the same effects as in this fifth embodiment is obtained.

Embodiment 6.

Figure 12:
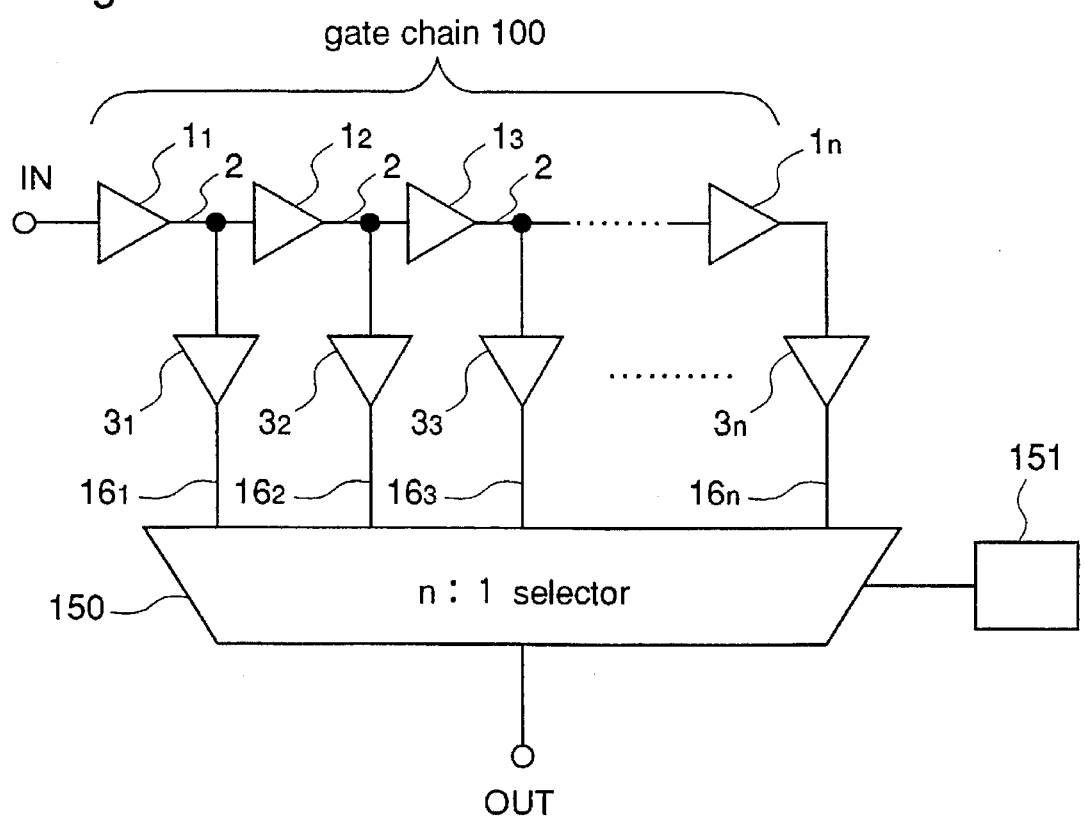
FIG. 12 is a diagram illustrating a variable delay circuit according to a sixth embodiment of the present invention.

The variable delay circuits of the first to fifth embodiments prevent deterioration of resolution of the variable delay circuit due to wiring delay of respective delay gates constituting the gate chain by adjusting the length of the separator gate wirings. However there are factors deteriorating the resolution of the variable delay circuit other than the wiring delay. For example, there is one due to process variations in making the transistors constituting the gates. In other words, when a process variation occurs, the delay time of a gate is varied due to a variation of a threshold voltage $V_{TH}$, and the delay time of a gate varies whereby the resolution and the maximum variable width of a variable delay circuit are varied. A sixth embodiment of the present invention provides a variable delay circuit which can cancel variations in the delay time due to process variations in making transistors, resulting in FIG. 12.

In the variable delay circuit of this sixth embodiment, the separator gate wirings $4_1, \ldots, 4_n$ of the first embodiment (FIG. 1) are replaced by wiring $16_1, \ldots, 16_n$.

Figure 13:
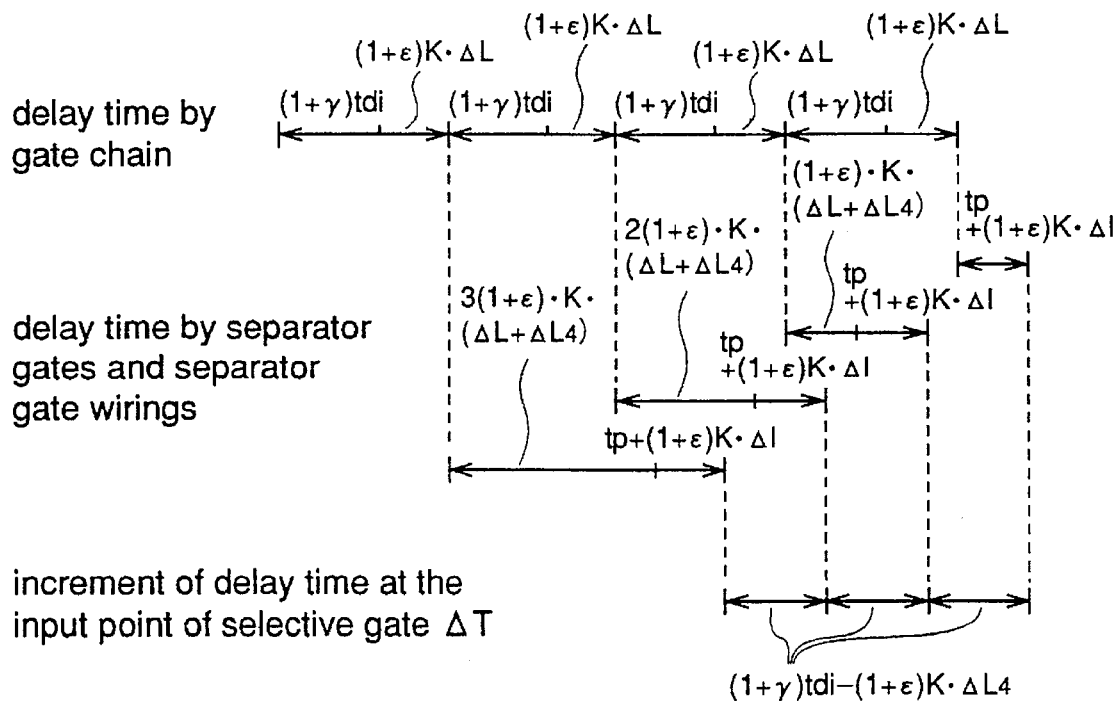
FIG. 13 is a timing chart illustrating the operation of the variable delay circuit of the sixth embodiment.

A description is given of the operation of this sixth embodiment in the case where delay gates are 4 (n=4). FIG. 13 shows a timing chart for explaining the resolution of this embodiment in which n=4. In the figure, reference character $t_{di}$ designates a delay time of respective delay gates $1_1, \ldots, 1_n$. Reference character $t_p$ designates a delay time of the separator gates $3_1, \ldots, 3_n$. Reference character $\Delta L$ designates a length of the delay gate wiring 2. Reference character K designates wiring length dependency of the gate delay time, i.e., an increment of delay time per a wiring length of 1 mm, determined by the size of the transistors constituting the gates, the parasitic capacitance due to the wiring connected to the gate, and the like. Reference character $\gamma$ designates a proportion of change of the gate delay time $t_{di}$ due to process variations, and reference character $\epsilon$ designates a proportion of change of the wiring length dependency K of the gate delay time due to process variations. In addition, the increment of the lengths of the separate gate wirings are set to become successively shorter by $(\Delta L+\Delta L_4)$ from the input side, finally becoming $\Delta l$, as shown in the following:

first stage separator gate wiring 161: $3(\Delta L+\Delta L_4)+\Delta l$ second stage separator gate wiring 162: $2(\Delta L+\Delta L_4)+\Delta l$ third stage separator gate wiring 163: $(\Delta L+\Delta L_4)+\Delta l$ fourth stage separator gate wiring 164: $\Delta l$.

The operation of the variable delay circuit of this sixth embodiment is similar to that of the first embodiment. As shown in a lower stage of FIG. 13, the increment $\Delta T$ of the delay time at the input timing of the n:1 selector gate 150 becomes, $$\Delta T = (1+\gamma)t_{di} - (1+\epsilon)K \cdot \Delta L_4$$

Here, in order to equalize the increment $\Delta T$ of the delay time to the delay time $t_{di}$ when there is no load, as in the first embodiment, $$\Delta L_4 = [\gamma/(1+\epsilon)](t_{di}/K)$$

In other words, by making the increment of the lengths of the separator gate wirings equal to the sum of the increments of the lengths of the separator gate wirings in the variable delay circuit of the first embodiment and $\Delta L_4$, the delay variations due to process variation can be further canceled.

While in this sixth embodiment, the variable delay circuit which is constituted by replacing the separator gate wirings $4_1, \ldots, 4_n$ in the variable delay circuit (FIG. 1) of the first embodiment with the separator gate wirings $16_1, \ldots, 16_n$, having further wiring length in order to cancel the delay time variation due to process variations is used as a separator gate wiring this arrangement can be applied to any of the variable delay circuits of the first to the fifth embodiments with the same effects as in this embodiment.

Further, while a description is given of the delay time variation due to process variations in this sixth embodiment, this embodiment can be applied to delay time variations due to other factors such as temperature variations, and variations in the power supply voltage, with the same effects as in this sixth embodiment.

Embodiment 7.

Figure 14:
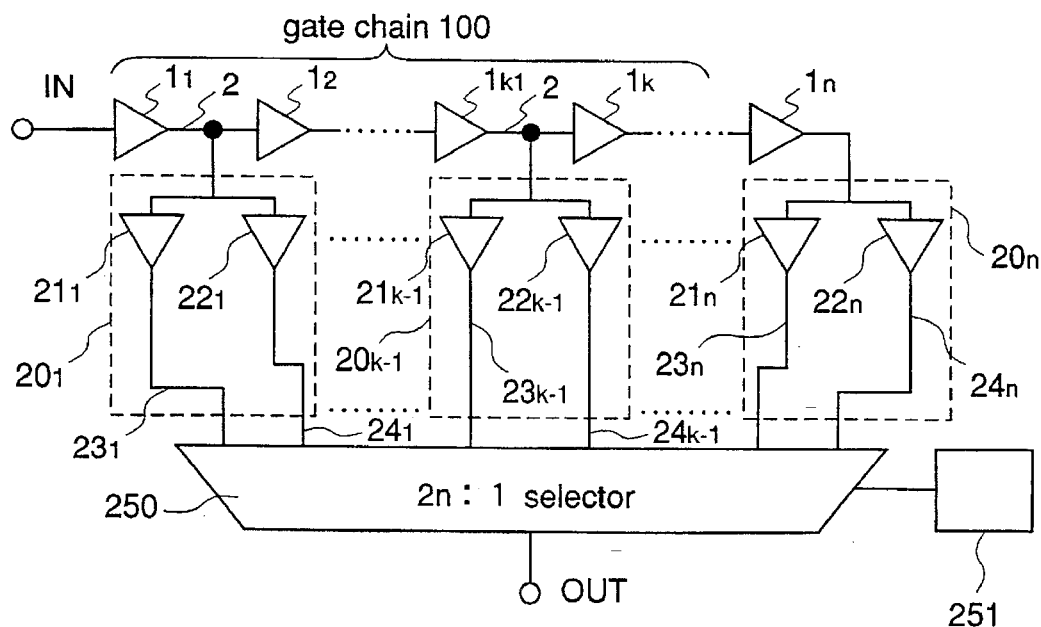
FIG. 14 is a diagram illustrating a variable delay circuit according to a seventh embodiment of the present invention.

A variable delay circuit according to a seventh embodiment of the present invention is shown in FIG. 14.

This seventh embodiment is implemented with an input terminal IN to which a signal to be delayed is input, a gate chain 100 comprising n delay gates $1_1, \ldots, 1_n$ delaying the input signal for a predetermined time, respectively, being connected in series to each other via delay gate wirings 2, n separator circuits $20_1, \ldots, 20_n$ whose inputs are respectively connected to connection nodes of the gate chain 100, a 2n:1 selector 250 which receive the 2n outputs of the separator circuits $20_1, \ldots, 20_n$ at its inputs and selects one of them to output it, and a select signal generating circuit 251 for controlling the 2n:1 selector 250.

The separator circuit $20_k$ ($1 \leq k \leq n$) includes a first separating system comprising a separator gate $21_k$ and a separator gate output wiring $23_k$ having one end connected to the output of the separator gate $21_k$ and another end connected to input of the 2n:1 selector 250, and a second separating system comprising a separator gate $22_k$ and a separator gate output wiring $24_k$ of which one end is connected to the output of the separator gate $22_k$ and the other end is connected to the input of the 2n:1 selector 250. The inputs of the separator gate $21_k$ and $22_k$ are connected to output of the delay gate $1_k$.

Here, the delay time of each of delay gates $1_1, \ldots, 1_n$ is $t_{di}$, and the delay time of each of separator gates $21_1, \ldots, 21_n$ and $22_1, \ldots, 22_n$ is $t_p$, and the length of the delay gate wiring 2 is $\Delta L$.

In addition, the lengths of the separator gate wirings $23_1, \ldots, 23_n$ are as follows from the input signal side:

| first stage: | $(n-1)\Delta L + \Delta l$ |
|---|---|
| second stage: | $(n-2)\Delta L + \Delta l$ |
| third stage: | $(n-3)\Delta L + \Delta l$ |
| . | |
| . | |
| . | |
| n-th stage: | $\Delta l$, | becoming successively shorter by $\Delta L$, and the length of the separator gate wiring $24_1, \ldots, 24_n$ are as follows from the input signal side:

| first stage: | $(n-1)\Delta L + \Delta l + D$ (D: positive integer) |
|---|---|
| second stage: | $(n-2)\Delta L + \Delta l + D$ |
| third stage: | $(n-3)\Delta L + \Delta l + D$ |
| . | |
| . | |
| . | |
| n-th stage: | $\Delta l + D$. |

In other words, the variable delay circuit of this seventh embodiment is obtained by providing two separator gates which receive the outputs of the delay gates $1_1, \ldots, 1_n$ in parallel and connecting the separator gates and the selector through the separator gate wirings having respective different lengths.

Figure 15:
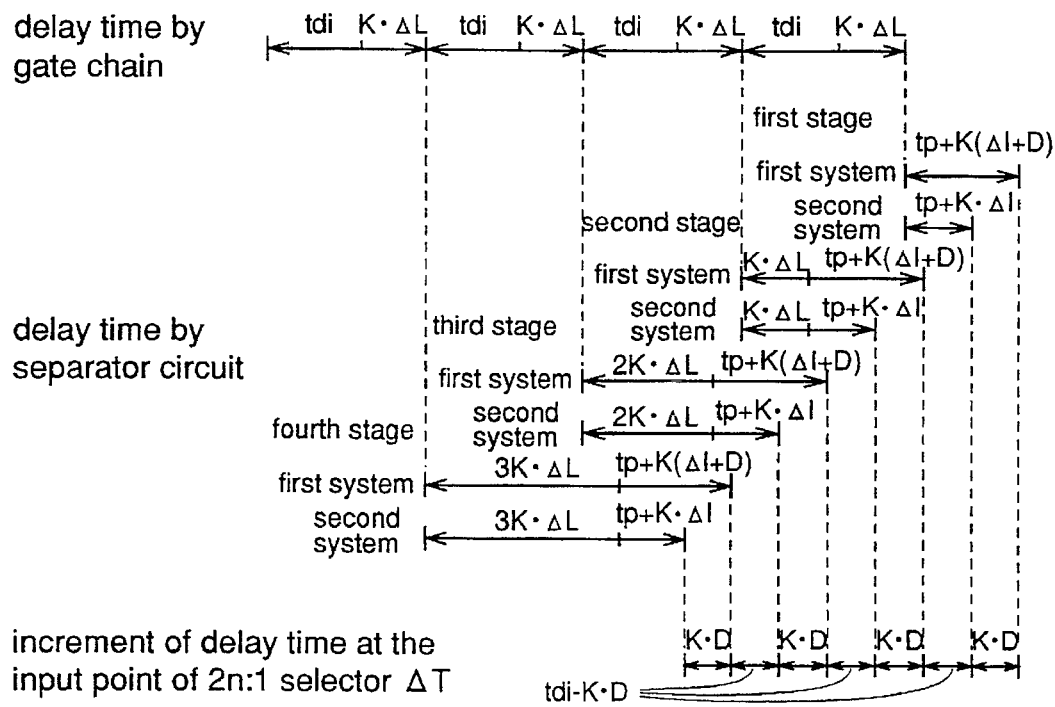
FIG. 15 is a timing chart illustrating the operation of the variable delay circuit of the seventh embodiment.

A description is given of the operation of this seventh embodiment with reference to a case where the number of the delay gates is 4 (n=4). FIG. 15 is a timing chart for explaining the resolution of this embodiment in a case where n=4. In the figure, reference character K represents wiring length dependency of the gate delay time, i.e., an increment of delay time per wiring length of 1 mm, which is dependent on the size of transistors constituting the gates, parasitic capacitance due to wiring connected to the gates, and the like. In addition, $K \cdot \Delta L$ represents an increment of gate delay time in a case where the length of the delay gate wiring is $\Delta L$.

When a signal to be delayed is input to the gate chain 100, the input signal is delayed by the delay gates $1_1, \ldots, 1_4$ constituting the gate chain 100 by $t_{di}+K \cdot \Delta L$, respectively. On the other hand, the outputs of respective delay gates $1_1, \ldots, 1_4$ are applied to the 2n:1 selector 250 via the separator circuits $20_1, \ldots, 20_4$, respectively. Then, since the output wiring lengths of the separator gate wirings $23_1, \ldots, 23_4$ and $24_1, \ldots, 24_4$ in the respective separator circuits $20_1, \ldots, 20_4$ are set to become successively shorter by $\Delta L$ as described above, it follows that:

in first stage separator circuit $20_1$, separator gate wiring $23_1$: $3\Delta L + \Delta l$ $24_1$: $3\Delta L + \Delta l + D$ in second stage separator circuit $20_2$, separator gate wiring $23_2$: $2K\Delta L + \Delta l$ $24_2$: $2K\Delta L + \Delta l + D$ in third stage separator circuit $20_3$, separator gate wiring $23_3$: $\Delta L + \Delta l$ $24_3$: $\Delta L + \Delta l + D$ in fourth stage separator circuit $20_4$, separator gate wiring $23_4$: $\Delta l$ $24_4$: $\Delta l + D$, and the delay times by the first and the second separating systems of the respective stage separator circuits $20_1, \ldots, 20_4$ become as follows successively from the input side, in first stage separator circuit $20_1$, first separator system: $3K \cdot \Delta L + (t_p + K \cdot \Delta l)$ second separator system: $3K \cdot \Delta L + (t_p + K \cdot (\Delta l + D))$ in second stage separator circuit $20_2$, first separator system: $2 \cdot \Delta L + (t_p + K \cdot \Delta l)$ second separator system: $2 \cdot \Delta L + (t_p + K(\Delta l + D))$ in third stage separator circuit $20_3$, first separator system: $K \cdot \Delta L + (t_p + K \cdot \Delta l)$ second separator system: $K \cdot \Delta L + (t_p + K(\Delta l + D))$ in fourth stage separator circuit $20_4$, first separator system: $t_p + K \cdot \Delta l$ second separator system: $t_p + K(\Delta l + D)$.

Therefore, as shown in a lower stage of FIG. 14, the increment $\Delta T$ of the delay time at the input timing of the 2n:1 selector 250 becomes, $$\Delta T = K \cdot D$$

or $$\Delta T = t_{di} - K \cdot D.$$

In this seventh embodiment, since a variable delay circuit has this construction, the resolution can be increased without increasing the number of stages of the delay gates constituting the variable delay circuit.

While the outputs of the respective delay gates are connected to the respective separator circuits having two separating systems in this seventh embodiment, it is possible that the outputs of the respective delay gates are connected to the respective separating circuits having m separating systems and that the delay data to be output is selected by an $(n \times m):1$ selector. In this case, the increment of the delay time can be $t_{di}/m$, resulting in further enhancing the resolution of the variable delay circuit.

Embodiment 8.

Figure 16:
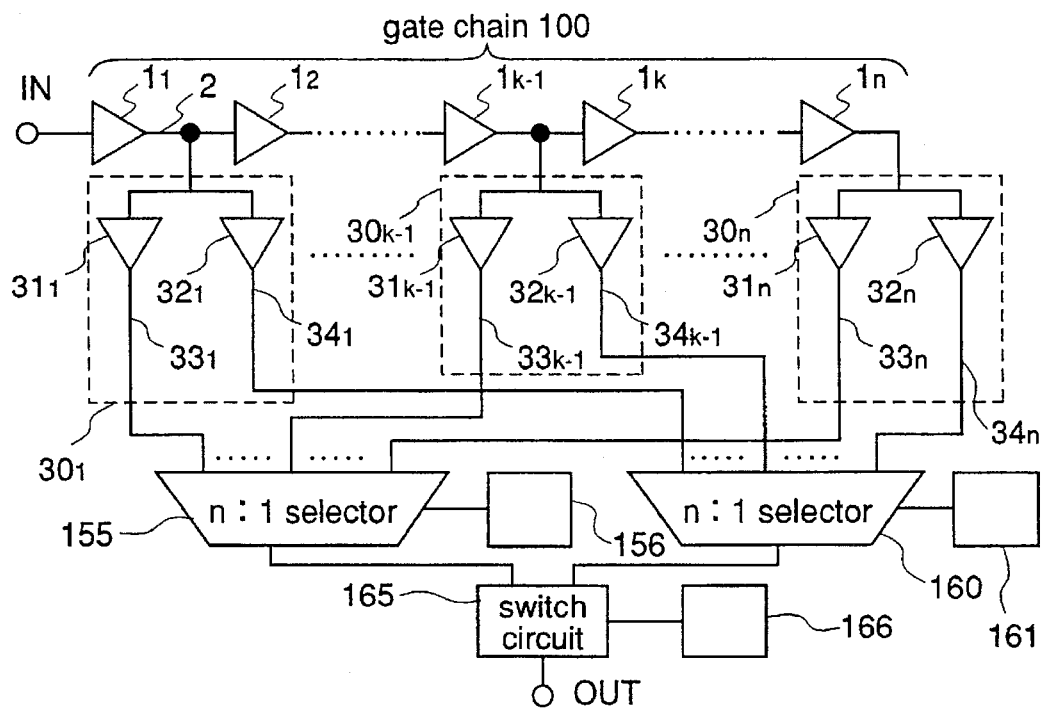
FIG. 16 is a diagram illustrating a variable delay circuit according to an eighth embodiment of the present invention.

FIG. 16 shows a variable delay circuit according to an eighth embodiment of the present invention.

This eighth embodiment is implemented with an input terminal IN to which a signal to be delayed is input, a gate chain comprising n delay gates $1_1, \ldots, 1_n$ delaying the input signal for a predetermined time, respectively, being connected in series to each other via delay gate wirings 2, n separator circuits $30_1, \ldots, 30_n$ whose inputs are connected to respective connection nodes of the gate chain 100 and which have a first and a second separating system, respectively, n:1 selectors 155, 160 whose inputs receive the outputs of the first and second separating systems of the respective separating circuits $30_1, \ldots, 30_n$ and which select one of them to output it, respectively, select signal generating circuits 156, 161 for controlling the n:1 selectors 155, 160, respectively, a switch circuit 165 which receives the outputs of the n:1 selectors 155, 160 and outputs one of them, and a switch signal generating circuit 166 for controlling the switch circuit 165. The delay resolution is selected by signals outside of the variable delay circuit.

The separator circuit 30K ($1 \leq K \leq n$) includes a first separating system comprising separator gate $31_k$ and a separator gate output wiring $33_k$ having one end connected to the output of the separator gate $31_k$ and another end connected to the input of the n:1 selector 155, and a second separating system comprising a separator gate 32K and a separator gate output wiring 34K having one end connected to the output of the separator gate 32K and another end connected to the input of the n:1 selector 160. The inputs of the separator gate 31K and 32K are connected to output of the delay gate 1k.

Here, the delay time of each of delay gates $1_1, \ldots, 1_n$ is $t_{di}$, and the delay time of each of separator gates $31_1, \ldots, 31_n$ and $32_1, \ldots, 32_n$ is $t_p$, and the length of the delay gate wiring 2 is $\Delta L$.

In addition, the lengths of the separator gate wirings $33_1, \ldots, 33_n$ are as follows from the input signal side:

| | |
|---|---|
| first stage: | $(n-1)\Delta L + \Delta l$ |
| second stage: | $(n-2)\Delta L + \Delta l$ |
| third stage: | $(n-3)\Delta L + \Delta l$ |
| . | |
| . | |
| n-th stage: | $\Delta l$, | becoming successively shorter by $\Delta L$, and the length of the separator gate wirings $34_1, \ldots, 34_n$ are as follows from the input signal side:

| | |
|---|---|
| first stage: | $(n-1)\Delta L_S + \Delta l$ |
| second stage: | $(n-2)\Delta L_S + \Delta l$ |
| third stage: | $(n-3)\Delta L_S + \Delta l$ |
| . | |
| . | |
| n-th stage: | $\Delta l$. |

Figure 17:
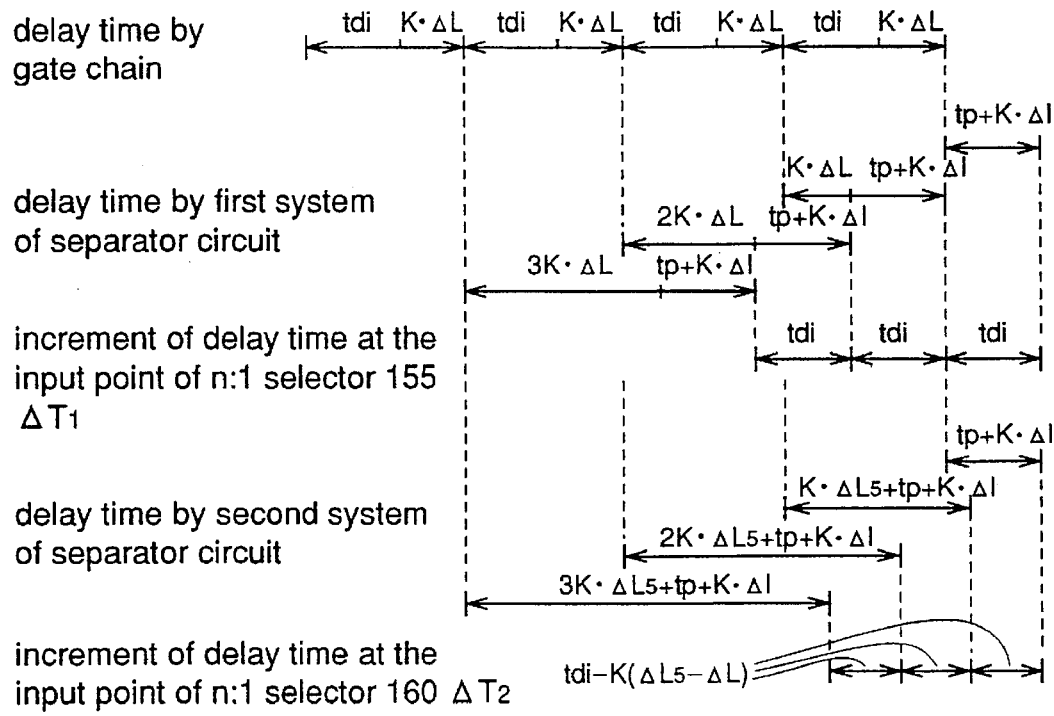
FIG. 17 is a timing chart illustrating the operation of the variable delay circuit of the eighth embodiment.
Figure 18:
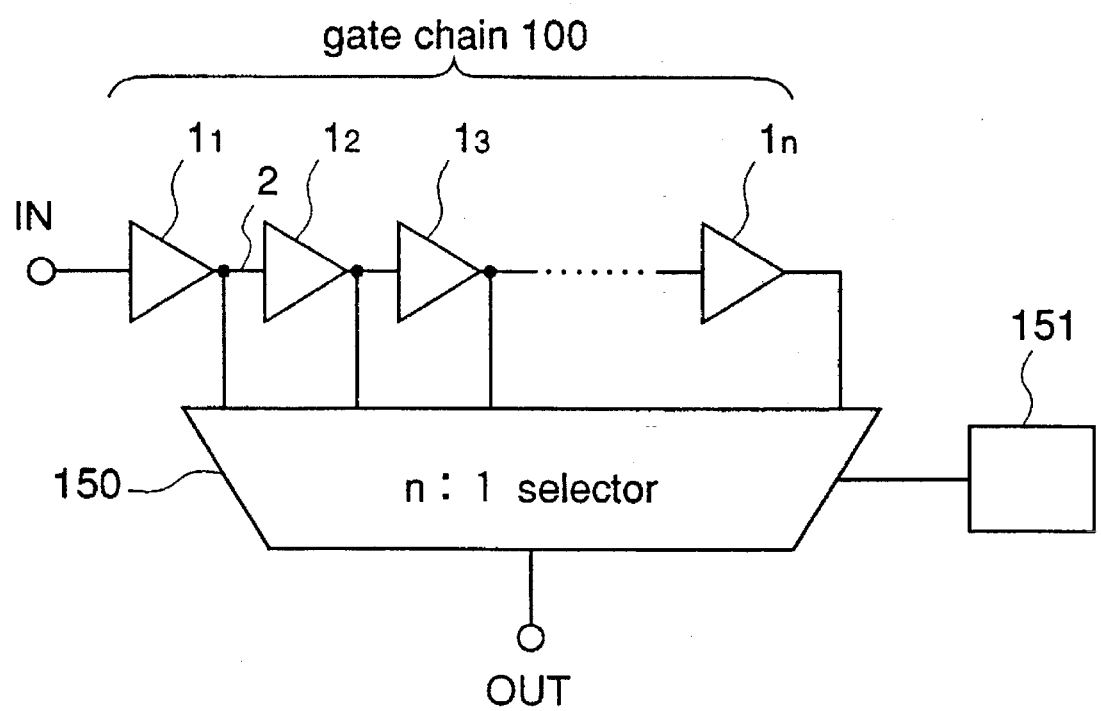
FIG. 18 is a diagram illustrating a variable delay circuit according to a prior art.
Figure 19:
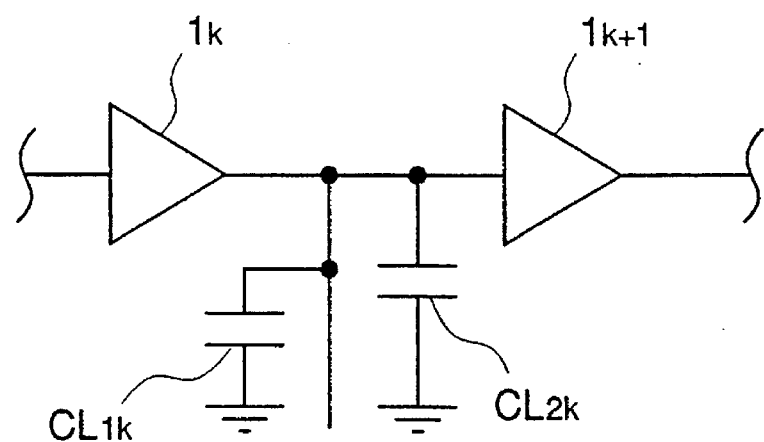
FIG. 19 is a diagram for explaining the parasitic capacitance of the prior art variable delay circuit.

A description is given of the operation of this eighth embodiment with reference to a case where the number of the delay gates is 4 (n=4). FIG. 17 is a timing chart for explaining the resolution of this embodiment in a case where n=4. In the figure, reference character K represents wiring length dependency of the gate delay time, i.e., an increment of delay time per wiring length of 1 mm, which is dependent on the size of transistor constituting the gates, parasitic capacitances due to wiring connected to the gates and the like. In addition, $K \cdot \Delta L$ represents an increment of gate delay time in a case where the length of the delay gate wiring 2 is $\Delta L$.

When a signal to be delayed is input to the gate chain 100, the input signal is delayed by respective delay gates $1_1, \ldots, 1_4$ constituting the gate chain 100 by $t_{di} + K \cdot \Delta L$. On the other hand, the outputs of respective delay gates $1_1, \ldots, 1_4$ are applied to the n:1 selector 155 via the first separating systems of the separating circuits $30_1, \ldots, 30_4$ and to the n:1 selector 160 via the second separating systems of the separator circuits $30_1, \ldots, 30_4$. Then, since the output wiring lengths of the separator gate wirings $33_1, \ldots, 33_4$ and $34_1, \ldots, 34_4$ in the respective separator circuits $30_1, \ldots, 30_4$ are set to become successively shorter by $\Delta L$ and $\Delta L_s$, respectively, as described above, it follows that:

in first stage separator circuit $30_1$, separator gate wiring $33_1$: $3\Delta L + \Delta l$ $34_1$: $3\Delta L_s + \Delta l$ in second stage separator circuit $30_2$, separator gate wiring $33_2$: $2\Delta L + \Delta l$ $34_2$: $2\Delta L_s + \Delta l$ in third stage separator circuit $30_3$, separator gate wiring $33_3$: $\Delta L + \Delta l$ $34_3$: $\Delta L_s + \Delta l$ in fourth stage separator circuit $30_4$, separator gate wiring $33_4$: $\Delta l$ $34_4$: $\Delta l$, and the respective delay times of the first and the second separating systems of the respective stage separating circuits $30_1, \ldots, 30_4$ become as follows, successively from the input side, First separating system, first stage separator circuit $30_1$: $3K \cdot \Delta L + (t_p + K \cdot \Delta l)$ second stage separator circuit $30_2$: $2K \cdot \Delta L + (t_p + K \cdot (\Delta l)$ third stage separator circuit $30_3$: $K \cdot \Delta L + (t_p + K \cdot \Delta l)$ fourth stage separator circuit $30_4$: $t_p + K \cdot \Delta l$ Second separating system, first stage separator circuit $30_1$: $3K \cdot \Delta L_s + (t_p + K \cdot \Delta l)$ second stage separator circuit $30_2$: $2K \cdot \Delta L_s + (t_p + K \cdot (\Delta l)$ third stage separator circuit $30_3$: $K \cdot \Delta L_s + (t_p + K \cdot \Delta l)$ fourth stage separator circuit $30_4$: $t_p + K \cdot \Delta l$ Therefore, as shown in a lower stage of FIG. 16, the increment $\Delta T_1$ (first separating system) of the delay time at the input timing of the n:1 selector 155 becomes, $$\Delta T_1 = t_{di},$$

and, the increment $\Delta T_2$ (second separating system) of delay time at the input timing of the n:1 selector 160 becomes, $$\Delta T_2 = t_{di} - K(\Delta_s - \Delta L).$$

Thus, the delay resolution can be changed in accordance with whether the first or the second separating system is selected by the switch circuit 165.

In this eighth embodiment having this construction, different resolutions can be selected in a variable delay circuit.

While a separator circuit having two separator systems is connected to the outputs of the respective delay gates in this eighth embodiment, it is possible that a separator circuit comprising m separating systems is connected to the outputs of the respective delay gates, and the outputs of the respective separating systems are input to m n:1 selectors and the outputs of the m n:1 selectors are selected by a switch circuit. In this case, m delay resolutions can be selected in a variable delay circuit.

While the lengths of the delay gate wirings 2 connecting the respective delay gates of the gate chain 100 to each other in the first to eighth embodiments, i.e., wirings for connecting the respective delay gates to each other, and wirings for connecting the respective delay gates to the separator gates, are constant, the present invention is also effective even in a case where the lengths of the respective delay gates wirings are different from each other as required due to circuit construction and layout. In this case, the separating gate wirings having lengths in accordance with the respective delay gate wirings may be added to the respective separator gates.

What is claimed is:

1. A variable delay circuit including:
   a gate chain comprising first to n-th delay gates (n is an integer larger than 2) connected in series via delay gate wirings, each of the delay gate wirings having the same wiring length, said first delay gate receiving an input signal for delay;

first to n-th separator gates to which outputs of said first to n-th delay gates are input, respectively;

first to n-th separator gate wirings respectively connected to outputs of said first to n-th separates gates, each of the first to n-th separator gate wirings having a length, the separator gate wiring lengths becoming successively shorter from said first separator gate to n-th separator gate for removing variation in the gate delay times of said first to n-th delay gates; and an n:1 selector, to which outputs of said first to n-th separator gates are connected by the separator gate wirings, for selecting one of the outputs of said first to n-th separator gates in accordance with a select signal.

2. A variable delay circuit including:
   a gate chain comprising first to n-th delay gates (n is an integer larger than 2) connected in series via delay gate wirings, each of the delay gate wirings having the same wiring length, said first delay gate receiving an input signal for delay; and an n:1 separating selector having n inputs connected to respective outputs of said first to n-th delay gates, one of the inputs being selected in accordance with a select signal, said n:1 separating selector comprising:

first to n-th separator gates respectively receiving outputs of said first to n-th delay gates;

a selection gate to which outputs of said first to n-th separator gates are connected and outputting one of the outputs of said first to n-th separator gates; and first to n-th separator gate wirings respectively connecting outputs of said first to n-th separator gates to said selection gate, each of the first to n-th separator gate wirings having a length, the lengths of the separator gate wirings becoming successively shorter from said first separator gate to said n-th separator gate.

3. The variable delay circuit of claim 1, wherein the lengths of the separator gate wirings from the first to n-th separator gate wirings vary between successive separator gates by a length equal to the wiring length of the respective delay gate wirings.

4. The variable delay circuit of claim 1, wherein the lengths of the separator gate wiring from the first to n-th separator gate wirings vary between successive separator gates by a length longer than the wiring length of the respective delay gate wirings.

5. The variable delay circuit of claim 1, wherein said first to n-th separator gates are inverting gates.

6. A variable delay circuit including:
   a gate chain comprising first to n-th delay gates (n is an integer larger than 2) connected in series via delay gate wirings, each of the delay gate wiring having the same wiring length, said first delay gate receiving an input signal for delay;

first to n-th separator circuits to which outputs of said first to n-th delay gates of said gate chain are connected and including first to m-th separating system, respectively; and an (m×n):1 selector to which outputs of said first to n-th separator circuits are connected at (m×n) inputs for selecting one of the inputs in accordance with a select signal, each of said first to m-th separating systems including separator gates having respective inputs connected in common, and respective separator gate wirings having one end connected to an output of a corresponding separator gate and another end connected to one of the inputs of said (m×n):1 selector, the separator gate wirings becoming successively shorter from said first separating system of said first separator circuit to said m-th separating system of said n-th separator circuit for removing variations in the gate delay times of said first to n-th delay gates.

7. A variable delay circuit including:

a gate chain comprising first to n-th delay gates (n is an integer larger than 2) connected in series via delay gate wirings, each of the delay gate wirings having the same wiring length, said first delay gate receiving an input signal for delay; and first to n-th separator circuits connected to respective outputs of said first to n-th delay gates of said gate chain and having first to m-th separating systems, respectively; and first to m-th n:1 selectors having n inputs respectively connected to corresponding outputs of each of said separator circuits at respective inputs for selecting one of the inputs in accordance with respective select signals, respectively, each of said first to m-th separating systems including a separator gate, said separator gates having respective inputs connected in common, and a separator gate wiring having one end respectively connected to an output of one of said separator gates and another end respectively connected to an input of one of said first to m-th n:1 selectors, the separator gate wirings of said first to n-th separator circuits becoming successively shorter from said first separator circuit to said n-th separator circuit, the separator gate wiring lengths among respective separating systems being different from each other.

8. The variable delay circuit of claim 6, wherein the lengths of the separator gate wirings from the first to n-th separator gate wirings vary between successive separator gates by a length equal to the wiring length of the respective delay gate wirings.

9. The variable delay circuit of claim 6, wherein the lengths of the separator gate wirings from the first to n-th separator gate wirings vary between successive separator gates by a length longer than the wiring length of the respective delay gate wirings.

10. The variable delay circuit of claim 6, wherein said separator gates in said first to n-th separator circuits are inverting gates.

* * * * *